US010069038B2

(12) United States Patent
Kim et al.

(10) Patent No.: US 10,069,038 B2
(45) Date of Patent: Sep. 4, 2018

(54) SUBSTRATE HAVING CONCAVE-CONVEX PATTERN, LIGHT-EMITTING DIODE INCLUDING THE SUBSTRATE, AND METHOD FOR FABRICATING THE DIODE

(71) Applicant: Seoul Viosys Co., Ltd., Ansan-si (KR)

(72) Inventors: Jae Kwon Kim, Ansan-si (KR); Sum Geun Lee, Ansan-si (KR); Kyung Wan Kim, Ansan-si (KR); Yeo Jin Yoon, Ansan-si (KR); Duk Il Suh, Ansan-si (KR); Ji Hye Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/732,455

(22) Filed: Jun. 5, 2015

(65) Prior Publication Data
US 2015/0270441 A1   Sep. 24, 2015

Related U.S. Application Data

(63) Continuation of application No. 14/348,005, filed as application No. PCT/KR2012/007912 on Sep. 28, 2012.

(30) Foreign Application Priority Data

Sep. 30, 2011   (KR) .................... 10-2011-0100097
Aug. 17, 2012   (KR) .................... 10-2012-0090150
Sep. 21, 2012   (KR) .................... 10-2012-0105322

(51) Int. Cl.
  *H01L 27/15*   (2006.01)
  *H01L 33/06*   (2010.01)
  (Continued)

(52) U.S. Cl.
  CPC ............ *H01L 33/20* (2013.01); *H01L 27/153* (2013.01); *H01L 33/06* (2013.01); *H01L 33/14* (2013.01);
  (Continued)

(58) Field of Classification Search
  CPC ....... H01L 27/153; H01L 33/06; H01L 33/14; H01L 33/16; H01L 33/22; H01L 33/20
  (Continued)

(56) References Cited

U.S. PATENT DOCUMENTS 6,358,764 B1 *  3/2002  Nemoto ............... H01L 27/153
                                              257/E27.121
6,821,804 B2 * 11/2004  Thibeault .............. H01L 33/20
                                              257/94

(Continued)

FOREIGN PATENT DOCUMENTS

CN    102169933 A    8/2011
JP    11-142610      5/1999
(Continued)

OTHER PUBLICATIONS

International Search Report dated Feb. 22, 2013 in International Application No. PCT/KR2012/007912.
(Continued)

*Primary Examiner* — Jarrett Stark
*Assistant Examiner* — Charles N Ausar-El
(74) *Attorney, Agent, or Firm* — Perkins Coie LLP

(57) ABSTRACT

Provided are a substrate having concave-convex patterns, a light-emitting diode (LED) including the substrate, and a method of fabricating the LED. The LED includes a substrate, and concave-convex patterns disposed in an upper surface of the substrate and having convexes and concaves defined by the convexes. Unit light-emitting device having a first conductive semiconduct or layer, an active layer, and a second conductive semiconductor layer disposed on the substrate in sequence is present.

18 Claims, 14 Drawing Sheets

(51) Int. Cl.
  *H01L 33/14* (2010.01)
  *H01L 33/16* (2010.01)
  *H01L 33/22* (2010.01)
  *H01L 33/20* (2010.01)
  *H01L 33/32* (2010.01)
  *H01L 33/00* (2010.01)
  *H01L 33/10* (2010.01)

(52) U.S. Cl.
  CPC .............. *H01L 33/16* (2013.01); *H01L 33/22* (2013.01); *H01L 33/32* (2013.01); *H01L 33/007* (2013.01); *H01L 33/10* (2013.01)

(58) Field of Classification Search
  USPC .......................................................... 257/13
  See application file for complete search history.

(56) References Cited

U.S. PATENT DOCUMENTS

| | | | | |
|---|---|---|---|---|
| 7,153,713 B2 * | 12/2006 | Lai | ........................ | H01L 33/007 257/79 |
| 7,781,790 B2 | 8/2010 | Minato et al. | | |
| 7,897,420 B2 * | 3/2011 | Chu | ........................ | H01L 33/22 257/98 |
| 8,058,082 B2 * | 11/2011 | Yu | ........................ | H01L 33/007 438/22 |
| 8,247,822 B2 * | 8/2012 | Cheng | ..................... | H01L 33/20 257/13 |
| 8,263,985 B2 * | 9/2012 | Choi | ........................ | H01L 33/20 257/13 |
| 8,461,611 B2 * | 6/2013 | Ono | ..................... | H01L 21/0243 257/103 |
| 8,779,463 B2 | 7/2014 | Narita et al. | | |
| 8,907,360 B2 * | 12/2014 | Lee | ........................ | H01L 33/46 257/100 |
| 8,963,178 B2 * | 2/2015 | Lee | ........................ | H01L 27/153 257/100 |
| 9,099,609 B2 * | 8/2015 | Nam | ........................ | H01L 33/16 |
| 2003/0057444 A1 * | 3/2003 | Niki | ........................ | H01L 33/007 257/200 |
| 2005/0179130 A1 * | 8/2005 | Tanaka | ................ | H01L 21/0237 257/730 |
| 2006/0204865 A1 * | 9/2006 | Erchak | ..................... | H01L 33/20 430/7 |
| 2007/0018187 A1 * | 1/2007 | Lee | ........................ | H01L 33/22 257/98 |
| 2008/0230793 A1 * | 9/2008 | Yoon | ........................ | H01L 33/22 257/94 |
| 2008/0251796 A1 * | 10/2008 | Lee | ........................ | H01L 27/153 257/88 |
| 2009/0159871 A1 * | 6/2009 | Lee | ........................ | H01L 33/22 257/13 |
| 2009/0207628 A1 | 8/2009 | Haase | | |
| 2010/0123118 A1 * | 5/2010 | Hu | ........................ | H01L 33/0075 257/13 |
| 2010/0197055 A1 | 8/2010 | Tanaka et al. | | |
| 2011/0042711 A1 * | 2/2011 | Choi | ........................ | H01L 33/32 257/103 |
| 2011/0127549 A1 * | 6/2011 | Lee | ........................ | H01L 27/153 257/88 |
| 2011/0127554 A1 | 6/2011 | Lee et al. | | |
| 2011/0140077 A1 * | 6/2011 | Song | ........................ | H01L 33/04 257/13 |
| 2011/0175122 A1 | 7/2011 | Kim | | |
| 2011/0210311 A1 * | 9/2011 | Kim | ........................ | H01L 27/156 257/13 |
| 2011/0227037 A1 * | 9/2011 | Su | ........................ | C23C 16/0227 257/13 |
| 2012/0138985 A1 * | 6/2012 | Ono | ..................... | H01L 21/0243 257/98 |
| 2013/0214245 A1 * | 8/2013 | Chang | ..................... | H01L 33/20 257/13 |
| 2013/0292643 A1 * | 11/2013 | Kuo | ........................ | H01L 33/22 257/13 |
| 2014/0191191 A1 * | 7/2014 | Huang | ..................... | H01L 33/24 257/13 |
| 2014/0231748 A1 * | 8/2014 | Kim | ........................ | H01L 33/22 257/13 |
| 2017/0155015 A1 * | 6/2017 | Ou | ........................ | H01L 33/22 |
| 2017/0186810 A1 * | 6/2017 | Lee | ........................ | H01L 27/15 |
| 2017/0236865 A1 * | 8/2017 | Kim | ........................ | H01L 27/153 257/93 |
| 2018/0108808 A1 * | 4/2018 | Ou | ........................ | H01L 33/22 |

FOREIGN PATENT DOCUMENTS

| | | |
|---|---|---|
| JP | 2000101136 | 4/2000 |
| JP | 2003197961 | 7/2003 |
| JP | 2005-047718 | 2/2005 |
| JP | 2007311784 | 11/2007 |
| JP | 2008131000 | 6/2008 |
| JP | 2008177528 | 7/2008 |
| JP | 2011176379 A | 9/2011 |
| KR | 10-2004-0019352 | 3/2004 |
| KR | 10-2011-0018563 | 2/2011 |
| WO | WO2011025291 A2 * | 3/2011 |

OTHER PUBLICATIONS

Japanese Patent Office, Japanese Patent Application No. 2014-533212, Office Action, dated Nov. 17, 2015, 2 pages.
State Intellectual Property Office of the PRC, Office Action, dated Mar. 2, 2016, 11 pages.

* cited by examiner

[Fig. 1a]
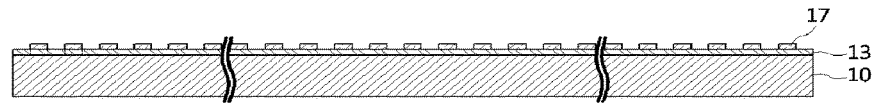
[Fig. 1b]
[Fig. 1c]
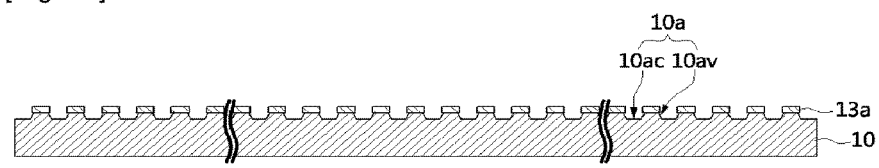
[Fig. 1d]
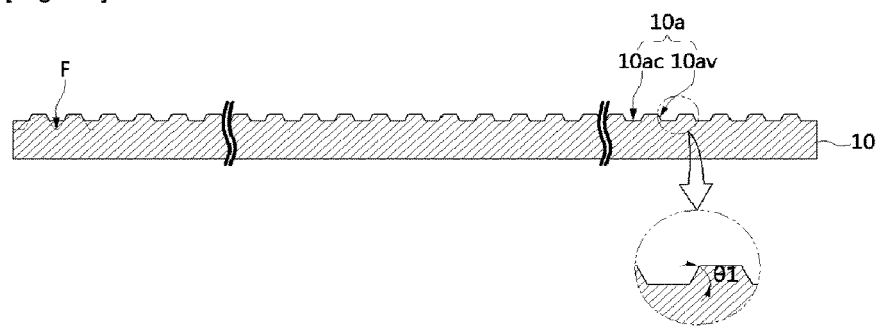
[Fig. 1e]
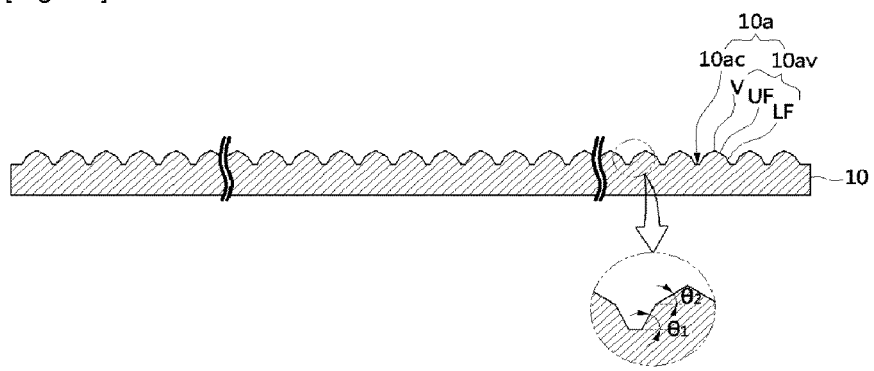
[Fig. 1f]
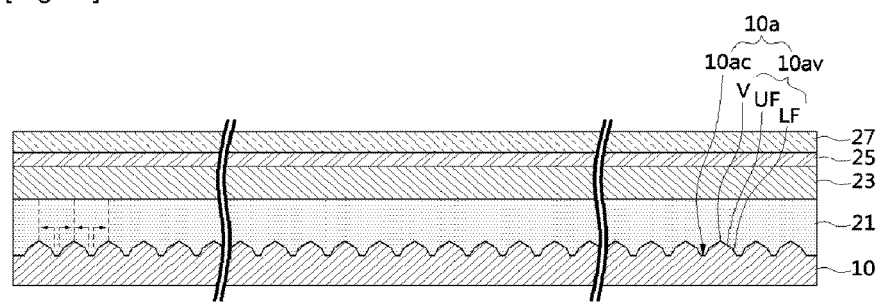

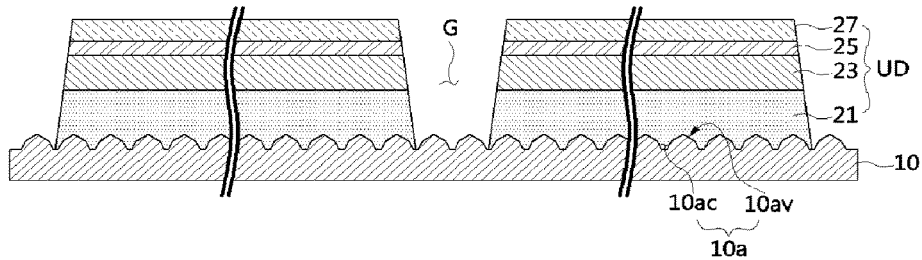
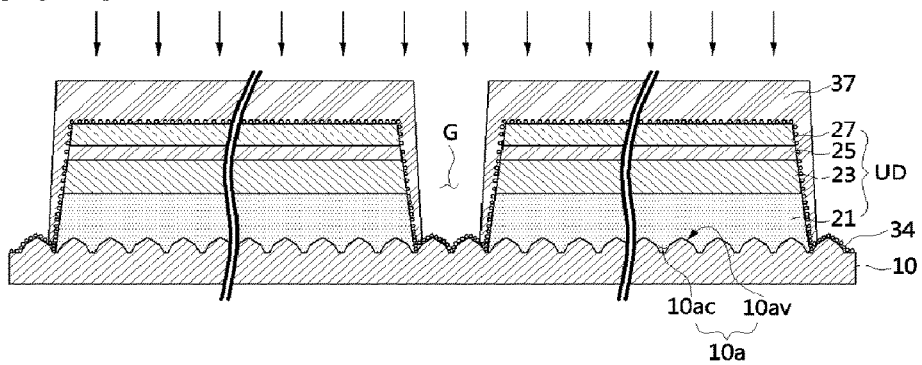
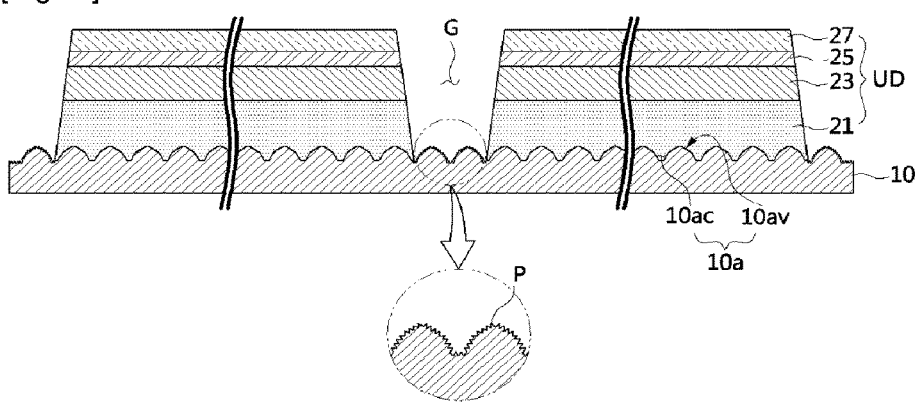
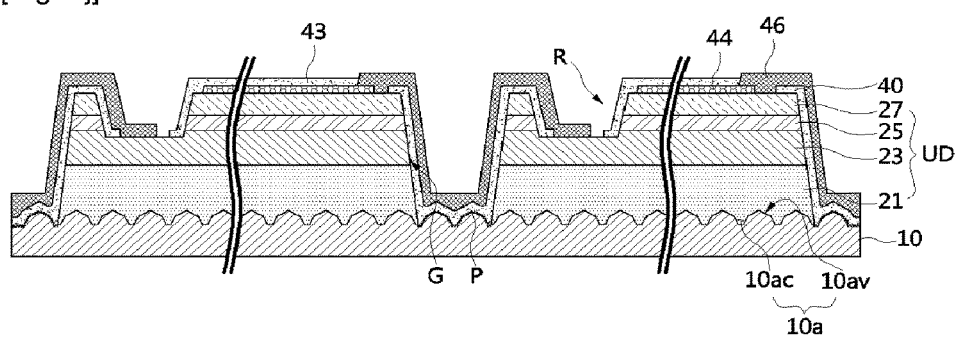

[Fig. 2]
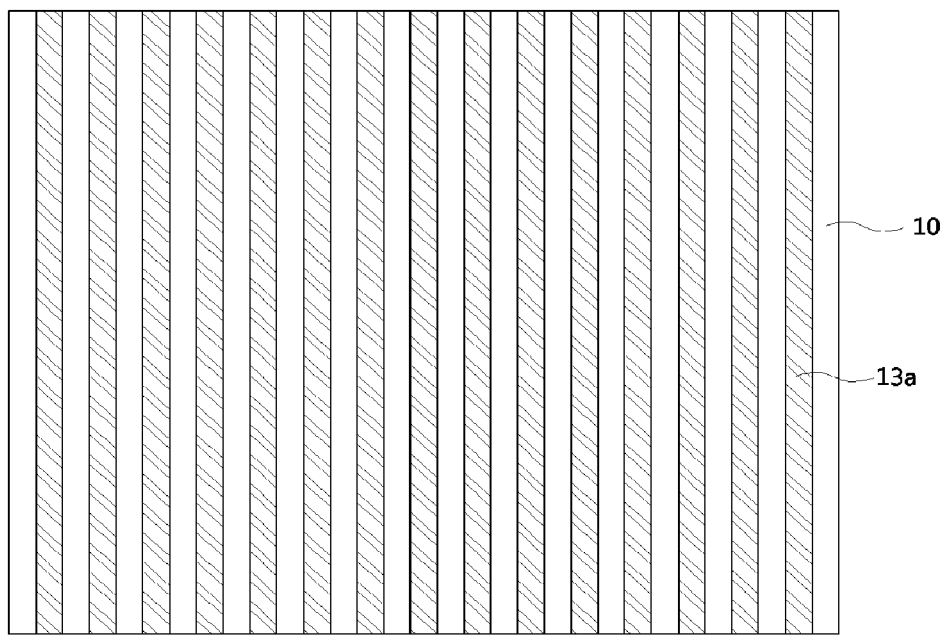
[Fig. 3]
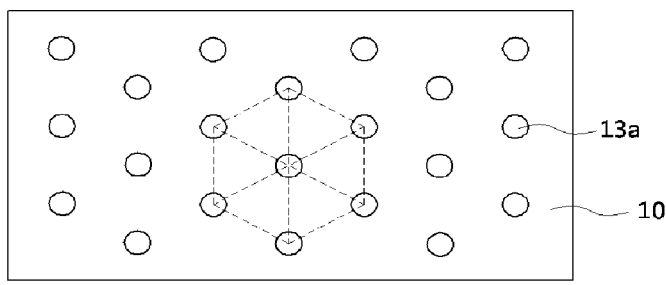
[Fig. 4]
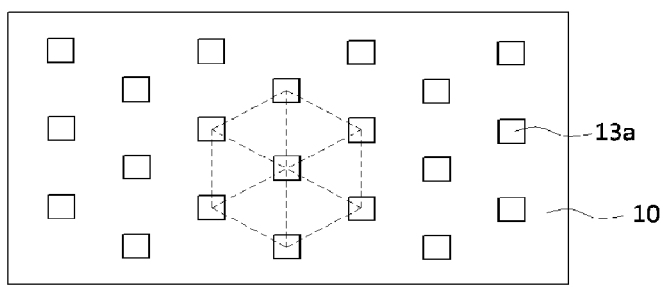

[Fig. 5]
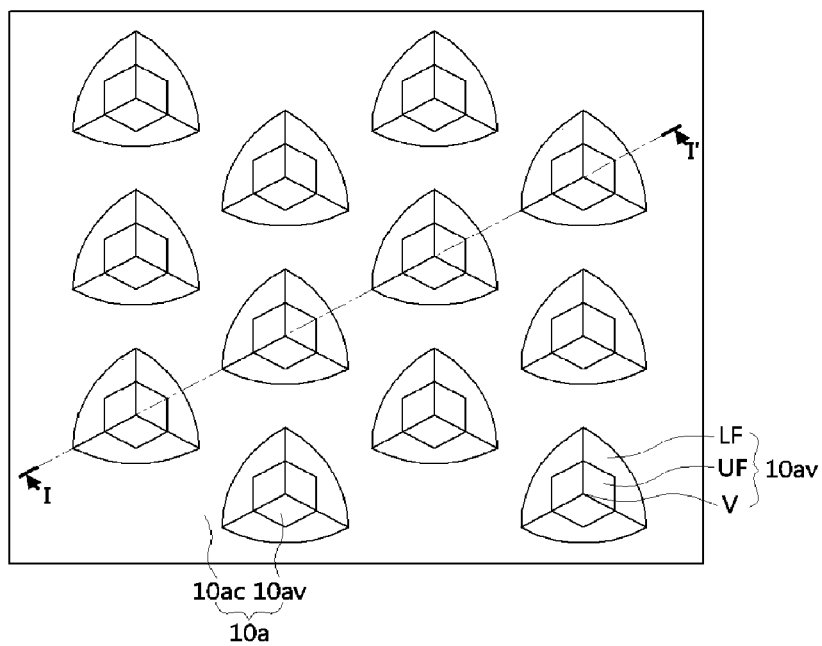
[Fig. 6]
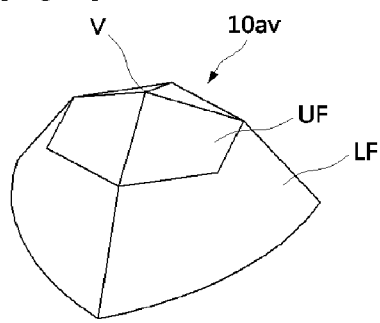
[Fig. 7a]
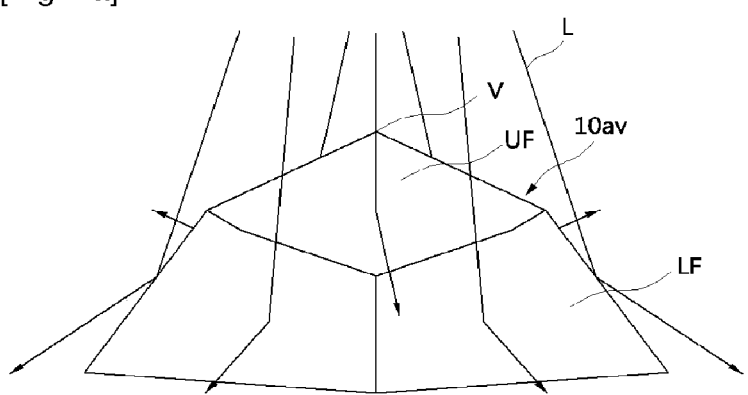

[Fig. 7b]
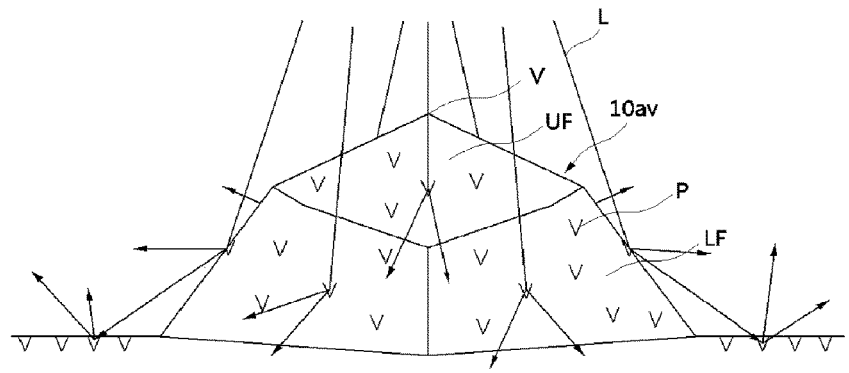
[Fig. 8a]
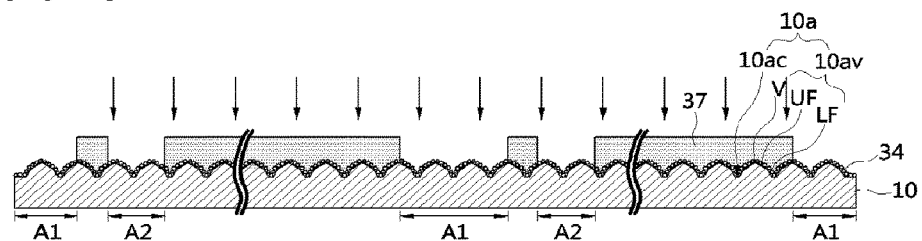
[Fig. 8b]
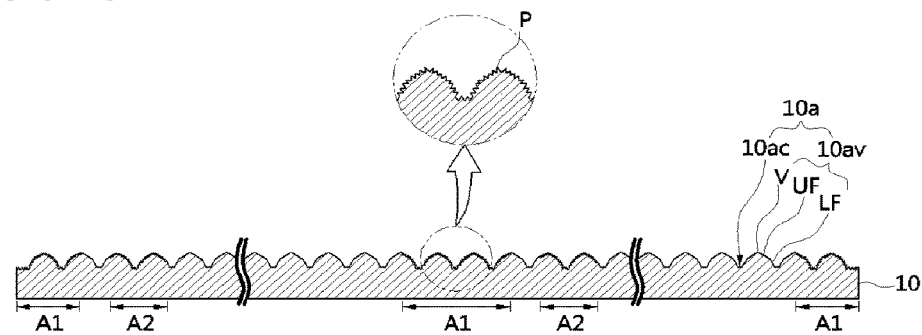
[Fig. 8c]
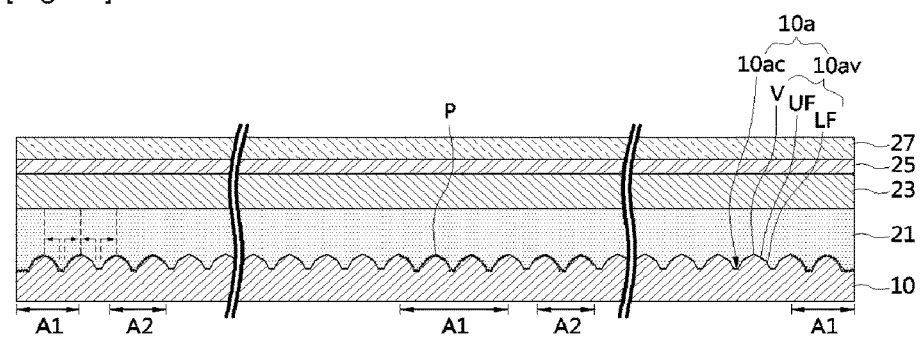

[Fig. 8d]
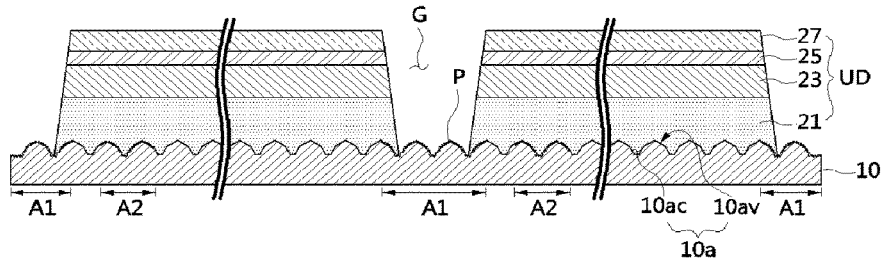
[Fig. 8e]
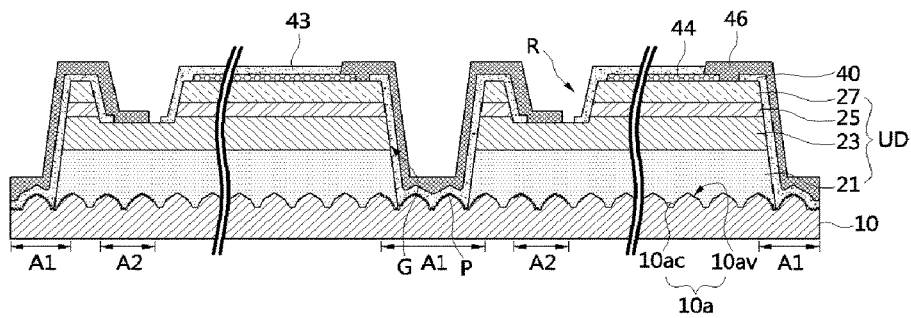
[Fig. 9a]
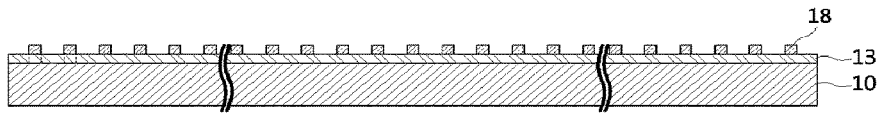
[Fig. 9b]
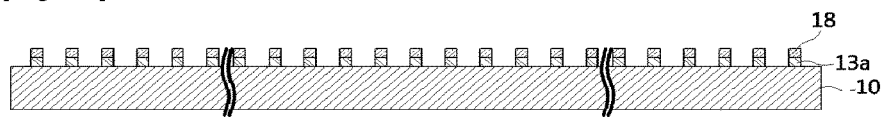
[Fig. 9c]
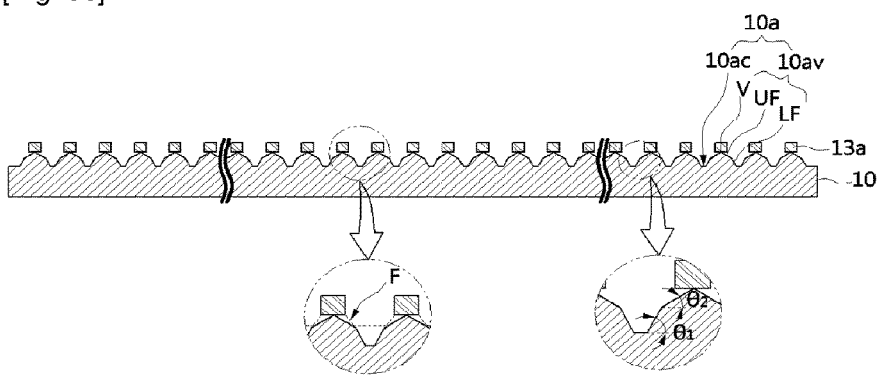
[Fig. 10a]
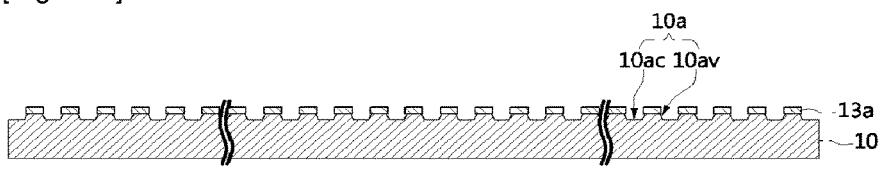

[Fig. 10b]
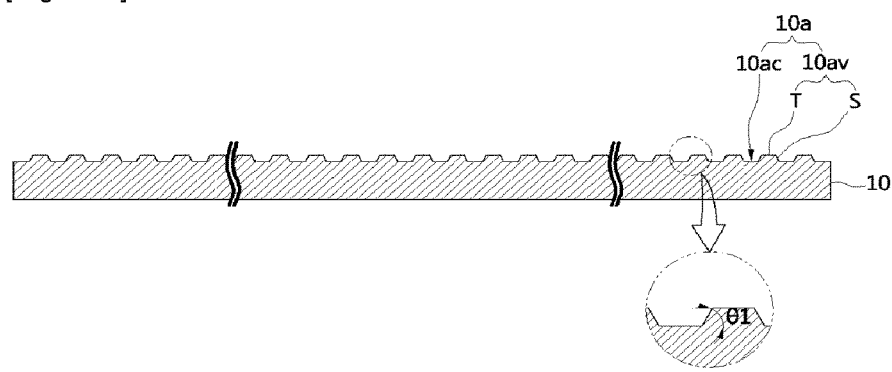
[Fig. 10c]
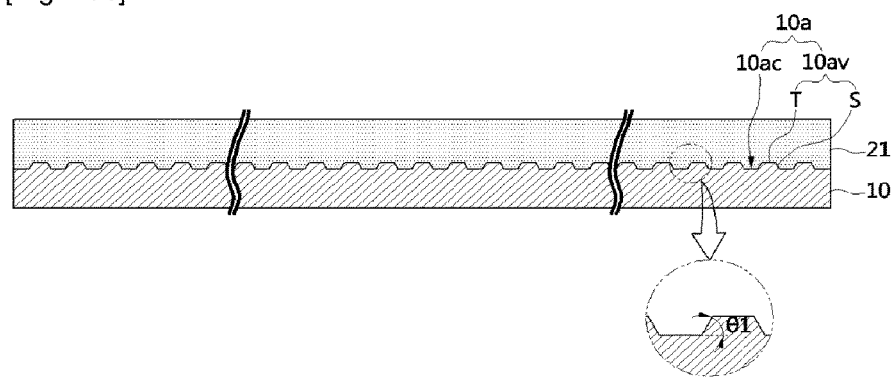
[Fig. 10d]
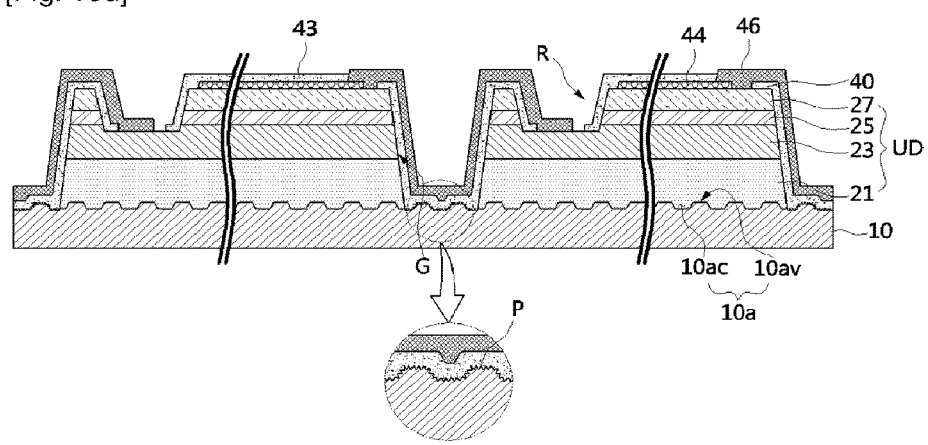

[Fig. 11]
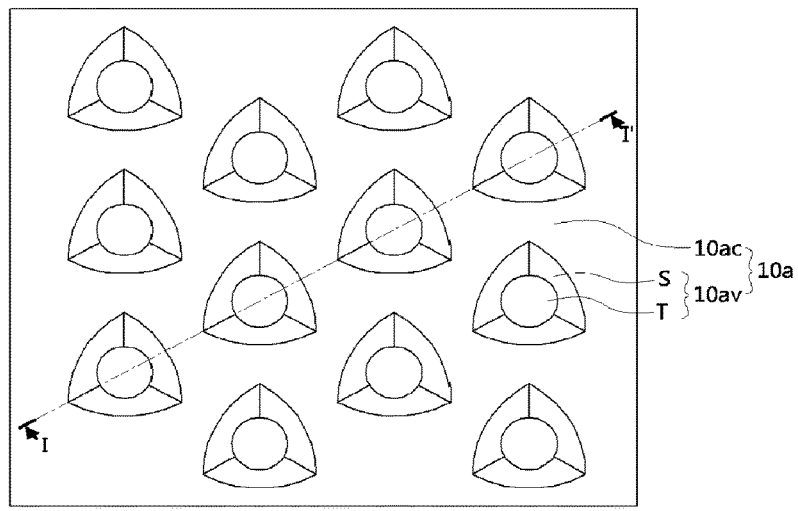
[Fig. 12a]
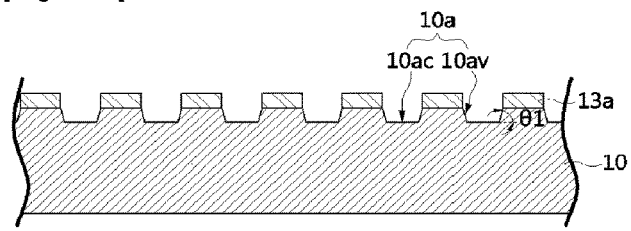
[Fig. 12b]
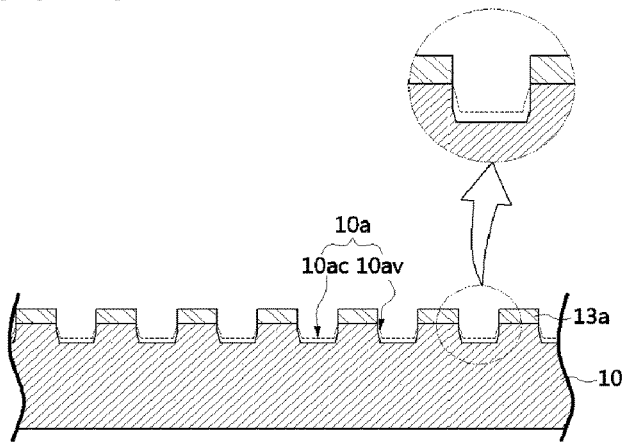
[Fig. 12c]
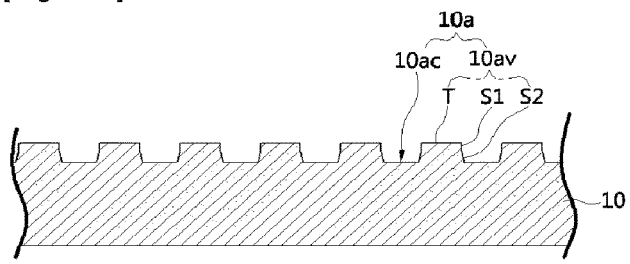

[Fig. 12d]
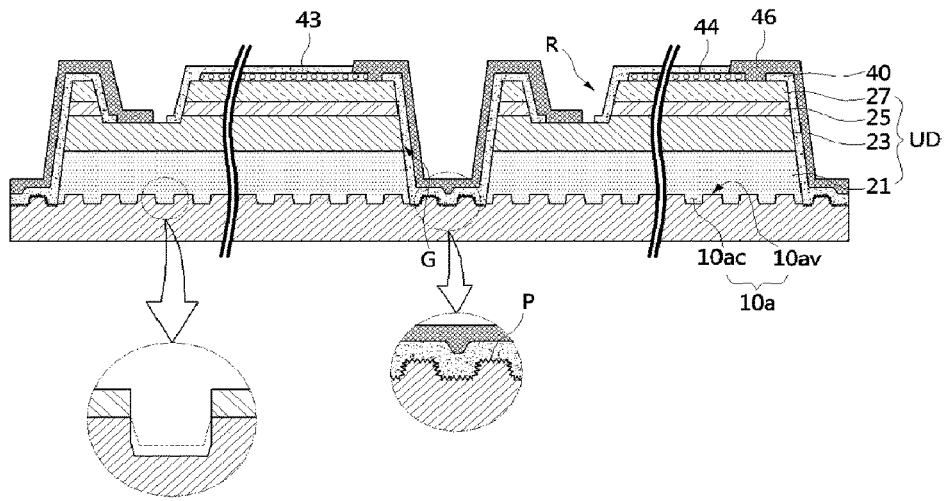
[Fig. 13a]
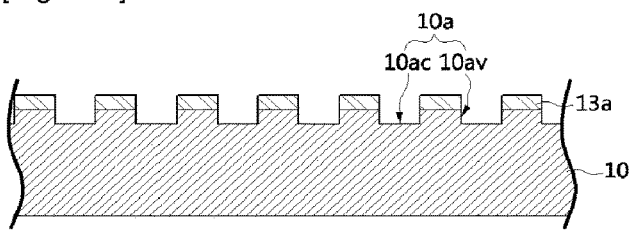
[Fig. 13b]
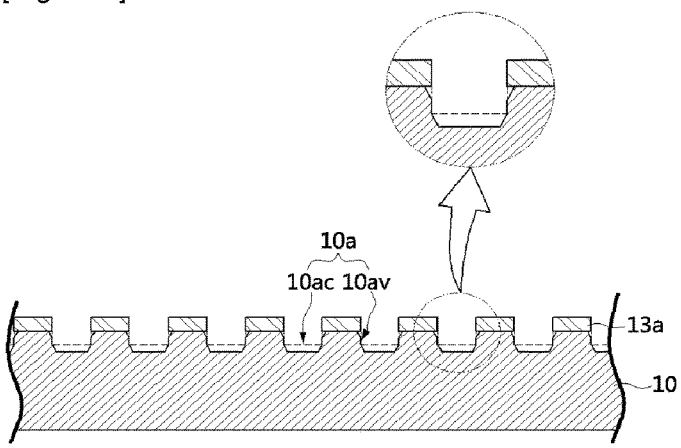
[Fig. 13c]
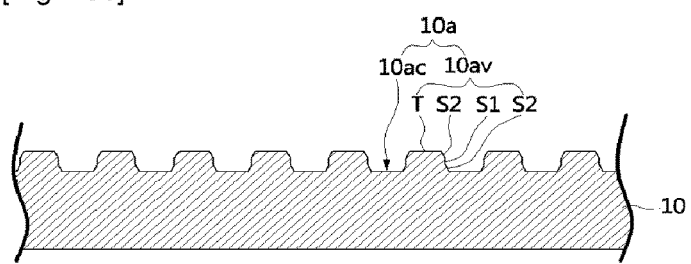

[Fig. 13d]
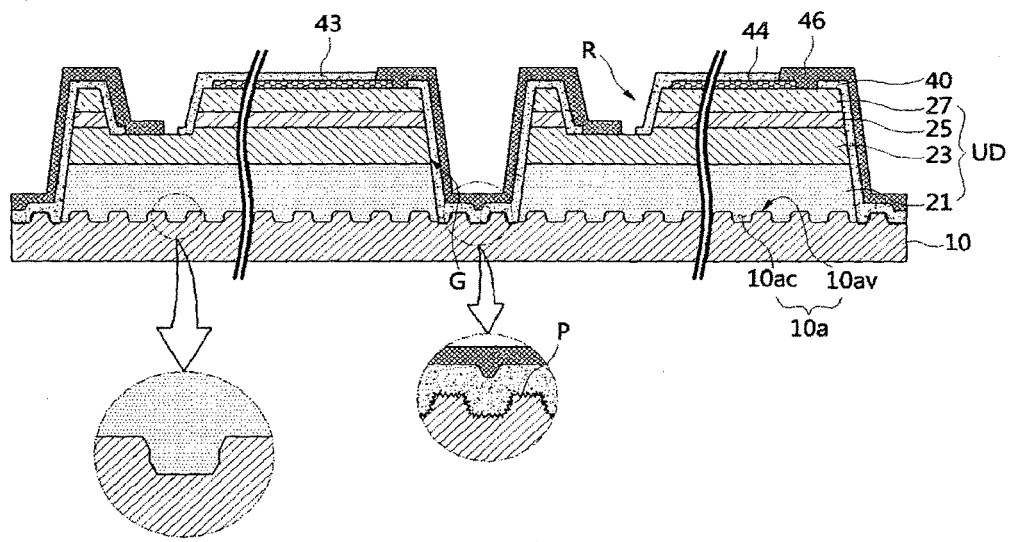
[Fig. 14]
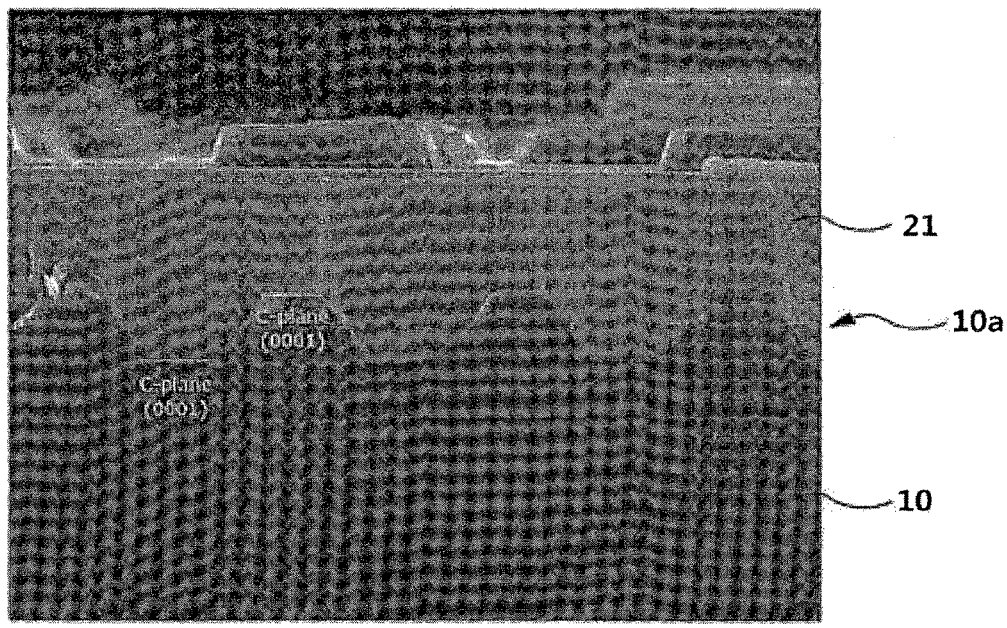

[Fig. 15]
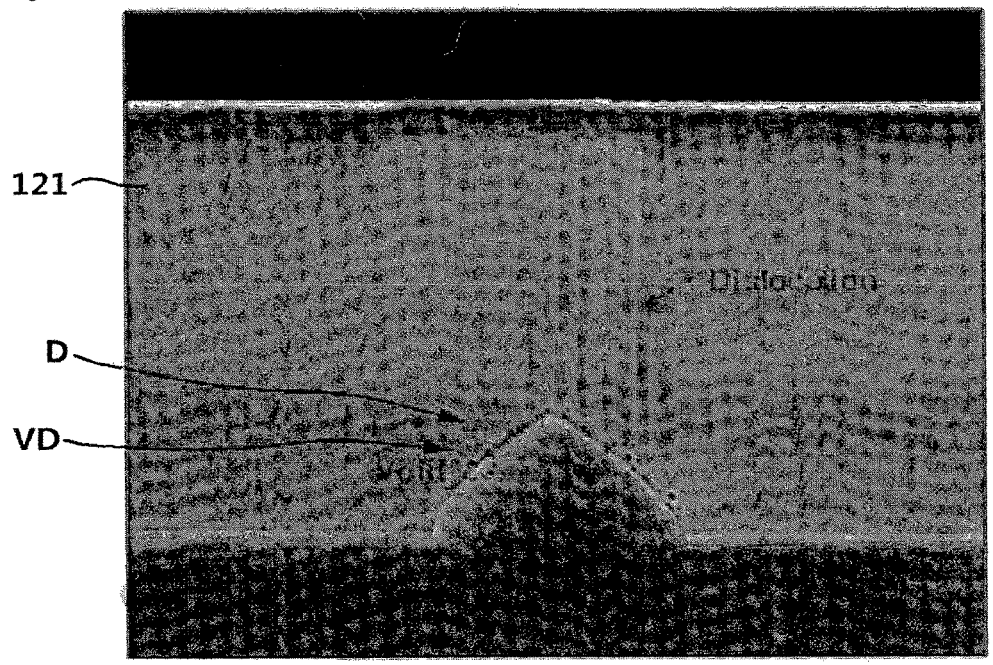
[Fig. 16a]
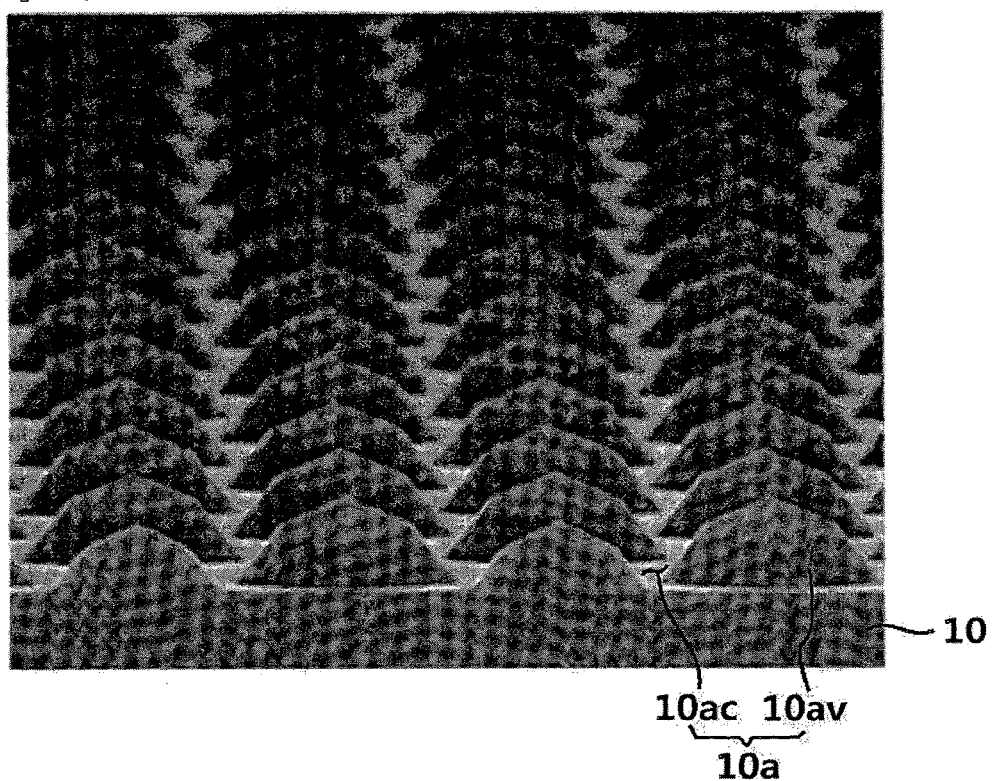

[Fig. 16b]
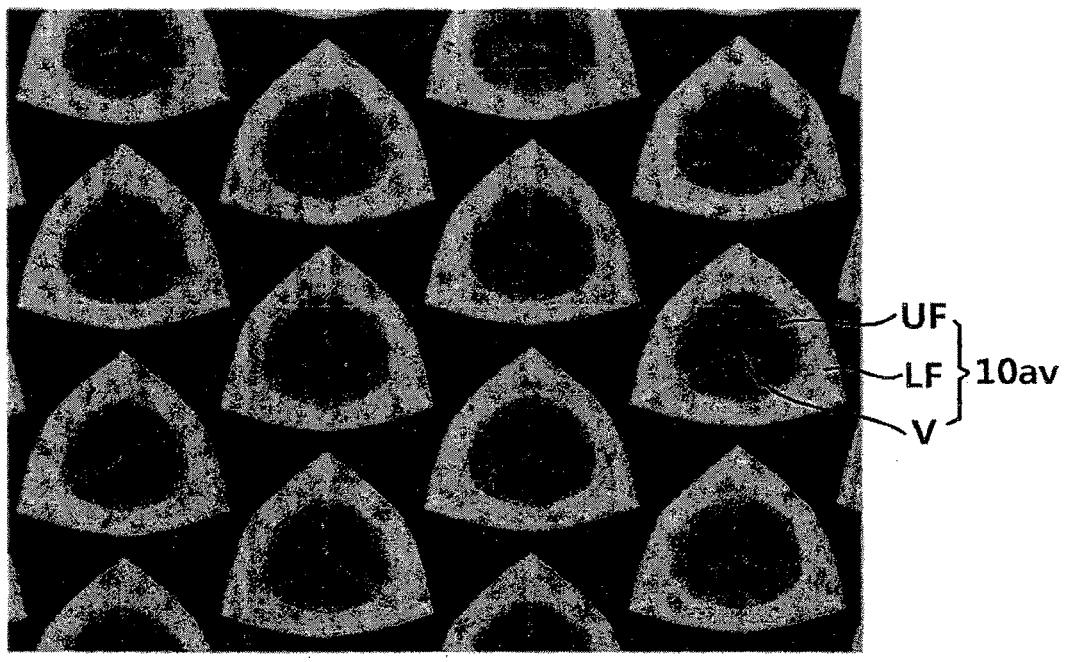
[Fig. 16c]
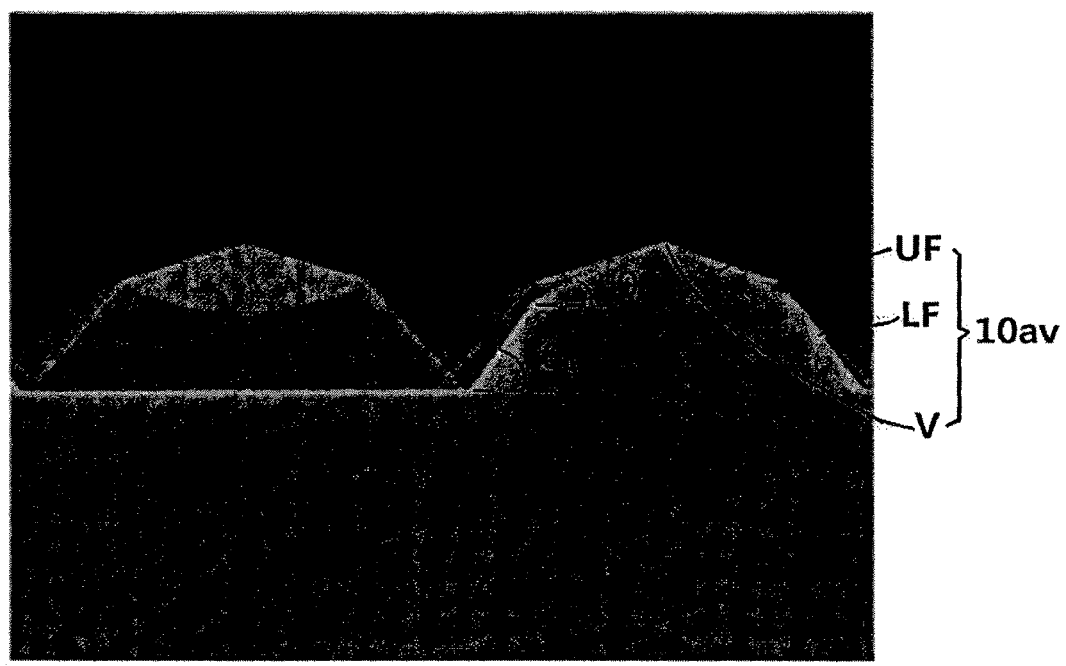

[Fig. 17]
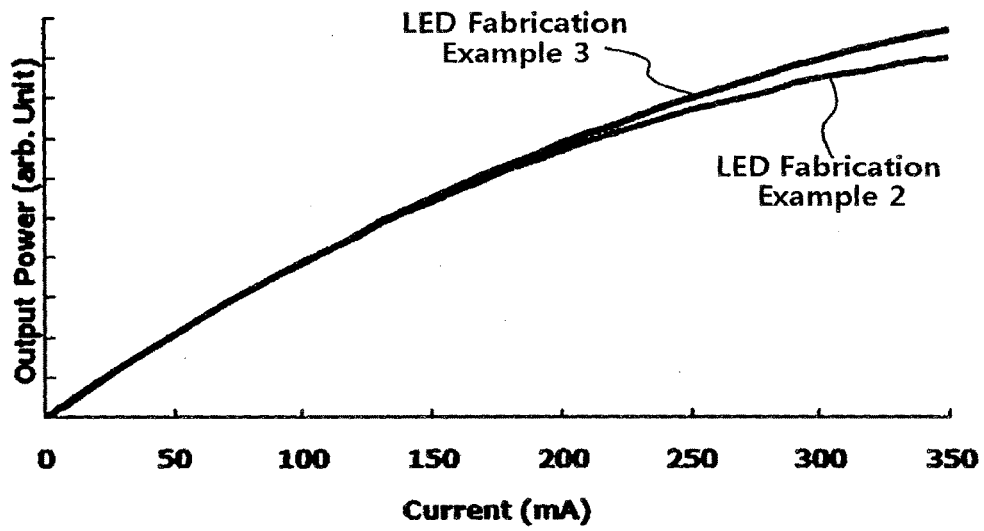
[Fig. 18a]
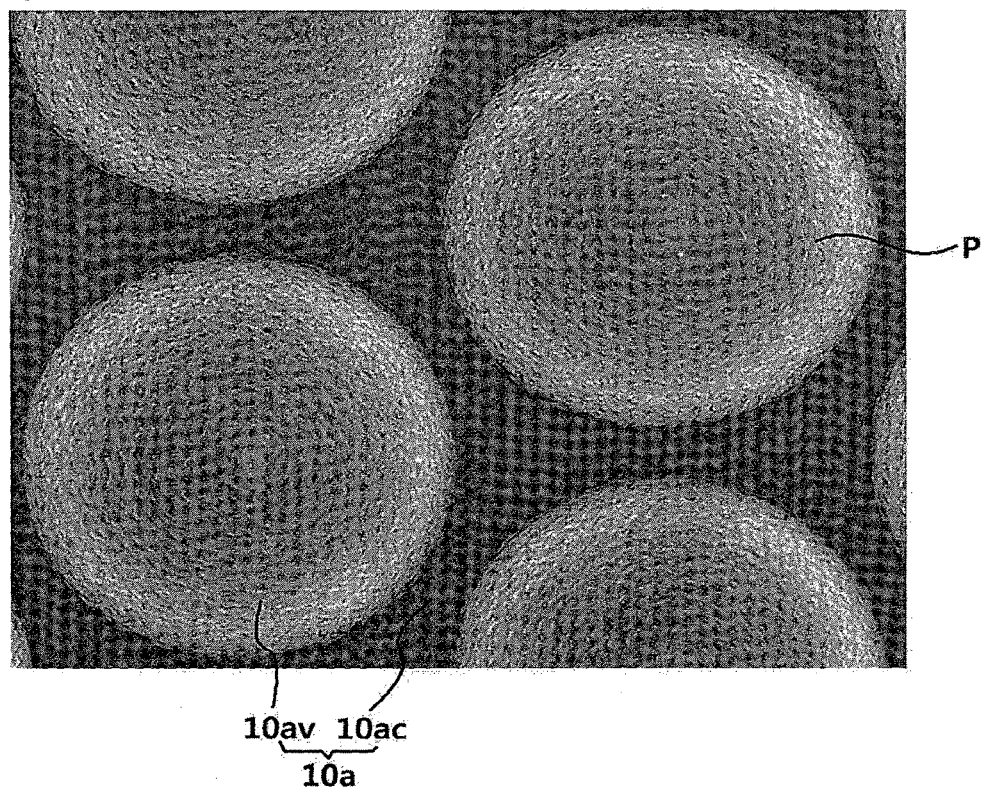

[Fig. 18b]
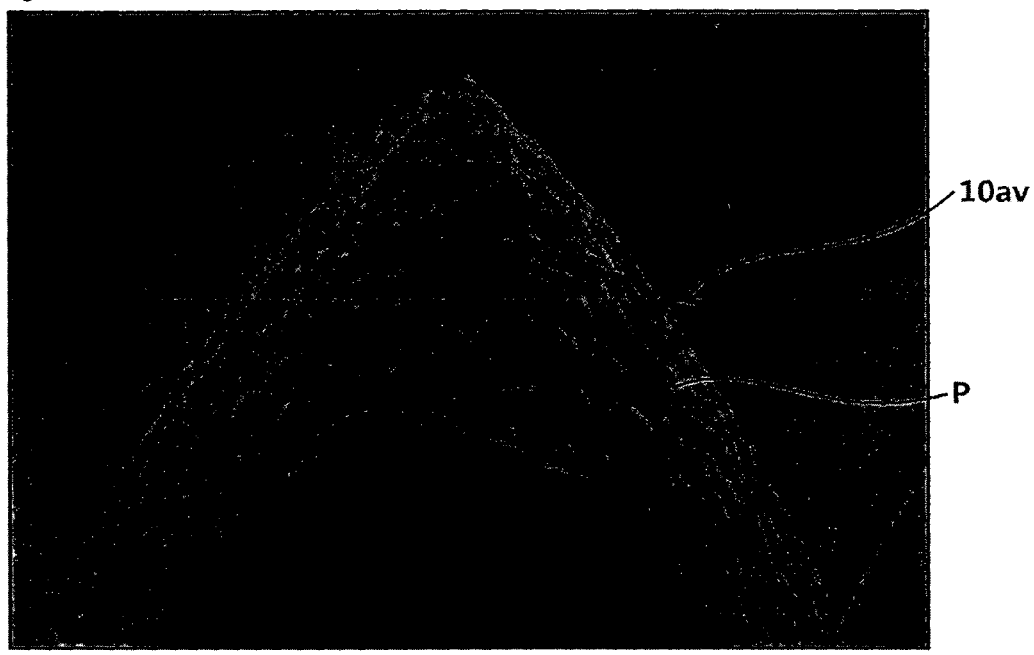

SUBSTRATE HAVING CONCAVE-CONVEX PATTERN, LIGHT-EMITTING DIODE INCLUDING THE SUBSTRATE, AND METHOD FOR FABRICATING THE DIODE

CROSS-REFERENCE TO RELATED APPLICATIONS

This application is a continuation of, and claims the benefits and priorities to U.S. patent application Ser. No. 14/348,005, filed on Mar. 27, 2014, which is the National Stage Entry of International Application PCT/KR2012/007912, filed on Sep. 28, 2012, and claims priorities from and the benefits of Korean Patent Application No. 10-2011-0100097, filed on Sep. 30, 2011, Korean Patent Application No. 10-2012-0090150, filed on Aug. 17, 2012, and Korean Patent Application No. 10-2012-0105322, filed on Sep. 21, 2012, which are incorporated herein by reference for all purposes as if fully set forth herein.

BACKGROUND

Field

The present invention relates to a semiconductor device, and more particularly, to a light-emitting diode (LED).

Discussion of the Background

An LED is a device having an n-type semiconductor layer, a p-type semiconductor layer, and an active layer disposed between the n-type and p-type semiconductor layers. When a forward electric field is applied to the n-type and p-type semiconductor layers, electrons and holes are injected into the active layer, and the injected electrons and holes are recombined in the active layer to emit light.

The efficiency of such an LED is determined according to internal quantum efficiency and external quantum efficiency, which is light extraction efficiency. As a method for improving light extraction efficiency, there is a method of forming concave-convex patterns on a substrate like a patterned sapphire substrate (PSS) and then epitaxially growing a semiconductor layer on the concave-convex patterns.

However, such concave-convex patterns may cause crystal defects in the epitaxial semiconductor layer. Thus, a method capable of improving light extraction efficiency while reducing such crystal detects caused by concave-convex patterns is required.

SUMMARY

The present invention is directed to providing a light-emitting diode (LED) of which light extraction efficiency is increased while crystal defects are reduced, and a method of fabricating the LED.

One aspect of the present invention provides a light-emitting diode (LED). The LED includes a substrate, and concave-convex patterns disposed in an upper surface of the substrate and having convexes and concaves defined by the convexes. The convexes has facets that are crystal planes. Unit light-emitting device having a first conductive semiconductor layer, an active layer, and a second conductive semiconductor layer disposed on the substrate in sequence is present.

Each of the convexes of the convex-concave patterns may have a plurality of facets that are crystal planes and one upper apex formed by at least some of the facets in contact with each other. The facets may include lower facets that are first crystal planes and upper facets that are second crystal planes, and the second crystal planes may gather together to form the upper apex. An inclination angle of the second crystal planes with respect to the substrate surface may be smaller than an inclination angle between the first crystal planes and the substrate surface. The convexes may have a stripe or island shape. When the convexes have the island shape, bottom surfaces of the convexes may have a triangle-like shape of which each line segment is a curve projected to the outside.

Each of the convexes of the concave-convex patterns may have facets that are crystal planes and a flat upper surface. Concave-convex patterns disposed in a partial area of the substrate may have pits in surfaces of the concave-convex patterns.

The LED has a plurality of unit light-emitting devices separated by at least one separation groove. The concave-convex patterns having the pits in the surface may be disposed in the separation groove. A separating insulating layer may be disposed in the separation groove. An interconnection electrically connecting one pair of adjacent unit light-emitting devices may be present on the separating insulating layer. Each of the unit light-emitting device may further include a mesa-etched region exposing the first conductive semiconductor layer in upper surfaces of the unit light-emitting device, and the concave-convex patterns having the pits in the surfaces may be disposed in an area corresponding to the mesa-etched region.

Another aspect of the present invention provides a substrate for an LED. The substrate has concave-convex patterns disposed in an upper surface of the substrate and having is convexes and concaves defined by the convexes, and the convexes have facets that are crystal planes.

Still another aspect of the present invention provides a method of fabricating an LED. The method includes forming an etching mask pattern on a substrate. Using the etching mask pattern as a mask, the substrate is wet-etched to form concave-convex patterns having convexes and concaves defined by the convexes in a surface of the substrate. On the substrate on which the concave-convex patterns are formed, a stacked body having a first conductive semiconductor layer, an active layer, and a second conductive semiconductor layer is formed.

According to the present invention, concave-convex patterns are formed by wet etching, and facets of the concave-convex patterns can be crystallographically stabilized, such that the crystal quality of an epitaxial layer formed on the concave-convex patterns can be improved.

BRIEF DESCRIPTION OF THE DRAWINGS

FIG. 1a to FIG. 1j are cross-sectional views illustrating a method of fabricating a light-emitting diode (LED) according to an exemplary embodiment of the present invention.

FIG. 2 to FIG. 4 are top views schematically showing shapes of etching mask patterns.

FIG. 5 is a top view of a concave-convex pattern.

FIG. 6 is a perspective view of one convex.

FIG. 7a and FIG. 7b are schematic diagrams schematically showing that light emitted from an active layer is reflected in several directions by a concave-convex pattern in a lower portion of an LED and a concave-convex pattern in a separation groove, respectively.

FIG. 8a to FIG. 8e are cross-sectional views illustrating a method of fabricating an LED according to another exemplary embodiment of the present invention.

FIG. 9a to FIG. 9c are cross-sectional views illustrating a method of fabricating an LED according to another exemplary embodiment of the present invention.

FIG. 10a to FIG. 10d are cross-sectional views illustrating a method of fabricating an LED according to another exemplary embodiment of the present invention.

FIG. 11 is a top view of a concave-convex pattern.

FIG. 12a to FIG. 12d are cross-sectional views illustrating a method of fabricating an LED according to another exemplary embodiment of the present invention.

FIG. 13a to FIG. 13d are cross-sectional views illustrating a method of fabricating an LED according to another exemplary embodiment of the present invention.

FIG. 14 and FIG. 15 are scanning electron microscope (SEM) images respectively taken after epitaxial layers were grown on concave-convex patterns in accordance with concave-convex pattern fabrication examples 1 and 2.

FIG. 16a to FIG. 16c are SEM images of a substrate having concave-convex patterns fabricated according to concave-convex pattern fabrication example 3.

FIG. 17 is a graph showing output power versus current of LEDs that were respectively fabricated according to LED fabrication example 2 and LED fabrication example 3.

FIG. 18a and FIG. 18b are SEM images of a substrate having concave-convex patterns fabricated according to concave-convex pattern fabrication example 4.

DETAILED DESCRIPTION OF THE ILLUSTRATED EMBODIMENTS

Hereinafter exemplary embodiments of the present invention will be described in detail. However, the present invention is not limited to the exemplary embodiments disclosed below, but can be implemented in various forms. The following exemplary embodiments are described in order to enable those of ordinary skill in the art to embody and practice the invention.

As used herein, when a layer is referred to as being on another layer or substrate, it can be directly on the other layer or the substrate or an intervening layer may also be present. In addition, as used herein, directional expressions such as upward, upper (portion), an upper surface, etc. may also be understood as the meanings of downward, lower (portion), a lower surface, etc. In other words, expressions of spatial directions should be understood as relative directions, but should not be limitedly understood as denoting absolute directions. It will be understood that, although the terms first, second, etc. may be used herein to describe various elements, these elements should not be limited by these terms. These terms are only used to distinguish one element from another.

In the drawings, the thicknesses of layers and areas may be exaggerated for clarity. Like numbers refer to like elements throughout the specification.

FIG. 1a to FIG. 1j are cross-sectional views illustrating a method of fabricating a light-emitting diode (LED) according to an exemplary embodiment of the present invention. Specifically, FIG. 1a to FIG. 1e are cross-sectional views illustrating a method of forming concave-convex patterns in a substrate, and FIG. 1f to FIG. 1j are cross-sectional views illustrating a method of fabricating an LED using the substrate having the concave-convex pattern.

Referring to FIG. 1a, a substrate 10 is provided. The substrate 10 may be a sapphire ($Al_2O_3$), silicon carbide (SiC), gallium nitride (GaN), indium gallium nitride (InGaN), aluminum gallium nitride (AlGaN), aluminum nitride (AlN), gallium oxide ($Ga_2O_3$), or silicon substrate. For example, the substrate 10 may be a sapphire substrate.

An etching mask layer 13 may be formed on an upper surface of the substrate 10. The etching mask layer 13 may be a silicon oxide layer, a silicon nitride layer, or a silicon oxynitride layer. However, the etching mask layer 13 is not limited to these and can be any material having an etching selectivity with respect to the substrate 10. A photoresist pattern 17 may be formed on the etching mask layer 13.

Referring to FIG. 1b, the etching mask layer 13 may be wet-etched or dry-etched using the photoresist pattern 17 as a mask. As a result, an etching mask pattern 13a may be formed. When the etching mask layer 13 is a silicon oxide layer, the etching mask layer 13 may be etched using HF or buffered oxide etch (BOE).

The etching mask pattern 13a may be formed in a variety of shapes. For example, as shown in FIG. 2 to FIG. 4, the etching mask pattern 13a may have a stripe shape (FIG. 2), or a circular island shape (FIG. 3) or polygonal island shape (FIG. 4). When unit patterns of the etching mask pattern 13a have island shapes, the unit patterns of the etching mask pattern 13a may be disposed such that six unit patterns surround one unit pattern in a hexagonal shape. However, the shape of the etching mask pattern 13a is not limited to this.

Referring to FIG. 1c, the photoresist pattern 17 may be removed to expose the etching mask pattern 13a. The substrate 10 may be etched a first time using the etching mask pattern 13a as a mask, such that concave-convex patterns 10a including concaves 10ac and convexes 10av may be formed in the upper surface of the substrate 10. The substrate 10 may be etched using a wet-etching method.

An etching solution used in the wet etching may exhibit remarkably different etching rates according to crystal directions of the substrate 10. In other words, the etching solution may preferentially etch the substrate 10 in a specific crystal direction. For example, the etching solution may be a mixed solution of sulfuric acid and phosphoric acid, a mixed solution of nitric acid and phosphoric acid, or a KOH solution when the substrate 10 is a sapphire substrate or a GaN substrate, a BOE or HF solution when the substrate 10 is a SiC substrate, and a KOH solution when the substrate 10 is a Si substrate. For example, when the substrate 10 is a c-plane sapphire substrate and the etching solution is obtained by mixing sulfuric acid and phosphoric acid at a volumetric ratio of 3:1, c-planes may be preferentially etched in the wet-etching process. In this case, bottom surfaces of the concaves 10ac and upper surfaces of the convexes 10ac may be c-planes.

Referring to FIG. 1d, the etching mask pattern 13a is removed to expose the upper surfaces of the convexes 10av. The upper surfaces of the convexes 10av may be planes, and facets thereof may have a first inclination angle η1 with respect to the substrate surface. These facets may be first crystal planes. Also, angles of the facets of the convexes 10av with respect to the substrate surface, that is, inclination angles, may be identical to or different from each other according to the facets. Also, the bottom surfaces of the concaves 10ac present between the convexes 10av may be planes that are substantially parallel to the substrate surface.

Referring to FIG. 1e, the substrate 10 having the concave-convex patterns 10a may be etched a second time. As a result, each of the convexes 10av may be altered to have lower facets LF that are the first crystal planes and upper facets UF that are second crystal planes different from the first crystal planes such that the second crystal planes gather together to have an upper vertex V.

The second etching may also be wet etching. An etching solution used in the second etching process may be the same as or different from the etching solution used in the first etching process. When the etching solution used in the second etching process is different from the etching solution used in the first etching process, a crystal plane that is different from the crystal plane of the substrate preferentially etched in the first etching process may be preferentially etched. When the etching solution used in the second etching process is the same as the etching solution used in the first etching process, the bottom surfaces of the concaves 10ac are continuously etched, and the first crystal planes of the convexes 10av are extended in a direction of the substrate 10 such that the lower facets LF may be formed.

Meanwhile, in upper portions of the convexes 10av, the first crystal planes that have already been formed in the first etching process may also be gradually etched to expose other crystal planes, that is, the second crystal planes, which may be the upper facets UF. Such second etching may be performed until the entire upper planes of the convexes 10av are etched, and the upper vertexes V at which the second crystal planes gather together is formed (see a dotted line F in FIG. 1d).

With reference to FIG. 5 and FIG. 6, concave-convex patterns will be described in further detail. A portion of FIG. 1e may correspond to a cross section taken along a cutting-plane line I-I' of FIG. 5. Also, FIG. 6 is a perspective view of one convex.

Referring to FIG. 1e, FIG. 5, and FIG. 6, the concave-convex patterns 10a have the plurality of convexes 10av and the concaves 10ac defined by the convexes 10av. The bottom surfaces of the concaves 10ac present between the convexes 10av may be planes that are substantially parallel to the substrate surface. Each of the convexes 10av may have a plurality of facets UF and LF that are crystal planes, and one upper vertex V formed by at least some of the facets UF and LF in contact with each other. Specifically, the facets UF and LF include lower facets LF that are first crystal planes and upper facets UF that are second crystal planes. Here, the upper vertex V may be formed by the upper facets UF in contact with each other. An inclination angle θ2 of the upper facets UF with respect to the substrate surface may be smaller than the inclination angle θ1 of the lower facets LF with respect to the substrate surface.

The convex 10av may have a stripe or island shape corresponding to the shape of the etching mask pattern 13a described with reference to FIG. 2 to FIG. 4. When the etching mask pattern 13a has a circular or polygonal island shape, in particular, a circular shape, a bottom surface defined by the lower facets LF of the convex 10av may have a triangle-like shape of which each line segment is a curve projected to the outside as shown in FIG. 5 and FIG. 6. Also, the upper facets UF of the convex 10av may have an almost hexagonal shape from the top view.

Referring to FIG. 1f, a buffer layer 21 may be formed on the substrate 10 on which the concave-convex patterns 10a are formed. The buffer layer 21 is formed to reduce lattice mismatch between the substrate 10 and a first conductive semiconductor layer, which will be described later, when the substrate 10 has a different lattice constant from the first conductive semiconductor layer. The buffer layer 21 may be an undoped GaN layer.

Since the uppermost ends of the convexes 10av are the pointed vertexes V and the facets UF and LF have the predetermined inclination angles with respect to the substrate surface, the buffer layer 21 may be vertically grown preferentially on the bottom surfaces of the concaves 10ac that are substantially parallel to the substrate surface. After that, the buffer layer 21 preferentially grown on the bottom surfaces of the adjacent concaves 10ac may meet together above the convexes 10av through horizontal growth. Thus, a threading dislocation density is reduced above the convexes 10av, and the crystal quality can be improved. Also, in comparison with the case of employing a general epitaxial lateral overgrowth (ELO) technique in which an epitaxial mask pattern is used, process steps may be reduced. In addition, since all the plurality of facets UF and LF of the convexes 10av are crystal planes formed by wet etching, surface states are crystallographically stabilized, and generation of lattice defects in the buffer layer 21 formed on the facets UF and LF may be prevented.

A first conductive semiconductor layer 23 may be formed on the buffer layer 21. The first conductive semiconductor layer 23 is a nitride-based semiconductor layer, and may be doped with n-type dopant. For example, the first conductive semiconductor layer 23 may include a plurality of $In_xAl_yGa_{1-x-y}N$ ($0 \le x \le 1$, $0 \le y \le 1$, $0 \le x+y \le 1$) layers having different compositions. After that, an active layer 25 may be formed on the first conductive semiconductor layer 23. The active layer 25 may be an $In_xAl_yGa_{1-x-y}N$ ($0 \le x \le 1$, $0 \le y \le 1$, $0 \le x+y \le 1$) layer, and may have a single quantum well structure or a multi-quantum well (MQW) structure. For example, the active layer 25 may have a single quantum well structure of an InGaN layer or an AlGaN layer, or an MQW structure that is an InGaN/GaN, AlGaN/(In)GaN or InAlGaN/(In)GaN multilayer structure. A second conductive semiconductor layer 27 may be formed on the active layer 25. The second conductive semiconductor layer 27 may also be a nitride-based semiconductor, and may be doped with a p-type dopant. For example, the second conductive semiconductor layer 27 may be an $In_xAl_yGa_{1-x-y}N$ ($0 \le x \le 1$, $0 \le y \le 1$, $0 \le x+y \le 1$) layer doped with Mg or Zn as a p-type dopant. Alternatively, the second conductive semiconductor layer 27 may include a plurality of $In_xAl_yGa_{1-x-y}N$ ($0 \le x \le 1$, $0 \le y \le 1$, $0 \le x+y \le 1$) layers having different compositions and doped with Mg or Zn as a p-type dopant.

The buffer layer 21, the first conductive semiconductor layer 23, the active layer 25, and the second conductive semiconductor layer 27 may constitute a stacked body, and may be formed using a variety of deposition or growth methods including metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), and so on.

Referring to FIG. 1g, a separation groove G that separates a plurality of unit light-emitting devices UD is formed by etching a partial area of the stacked body until the substrate 10 is exposed. The separation groove G may be formed by dry etching, for example, plasma etching. When an etching selectivity of an etching gas used in the dry etching is favorable, concave-convex patterns 10a exposed in the separation groove G may not be etched but may remain.

Referring to FIG. 1h, a metal layer (not shown) is stacked on the concave-convex patterns 10a exposed in the separation groove G and facets and upper surfaces of the unit light-emitting devices UD, and then the substrate on which the metal layer is stacked is heat-treated, such that metal clusters 34 may be formed. The metal layer may have a thickness of several nanometers to tens of nanometers, for example, a thickness of about 3 nm to about 20 nm, specifically, about 10 nm. Also, the metal layer and the metal clusters may be Ni, Al, or Pt. Before the metal layer is formed, a protective layer (not shown) may be selectively formed on the facets and the upper surfaces of the unit light-emitting devices UD. The protective layer may be a silicon oxide layer or a silicon nitride layer, and may prevent the metal clusters from reacting with the facets or the upper surfaces of the unit light-emitting devices UD.

On the metal clusters 34, photoresist patterns 37 covering the facets and the upper surfaces of the unit light-emitting devices UD may be formed. Using the photoresist patterns 37 and the metal clusters 34 as a mask, surfaces of concave-convex patterns 10a in the separation groove G may be etched. As a result, pits P of FIG. 1i may be formed in the surfaces of the concave-convex patterns 10a in the separation groove G, more specifically, in surfaces of convexes 10av and surfaces of concaves 10ac. The surfaces of the concave-convex patterns 10a in the separation groove G may be etched using plasma etching. At this time, the photoresist patterns 37 may prevent damage of the unit light-emitting devices UD caused by plasma.

Referring to FIG. 1i, the photoresist patterns 37 and the metal clusters 34 may be removed. As a result, the concave-convex patterns 10a having the surface pits P may be exposed in the separation groove G.

Referring to FIG. 1j, the second conductive semiconductor layer 27 and the active layer 25 in each of the unit light-emitting devices UD may be etched to form a mesa-etched region R that exposes the first conductive semiconductor layer 23. In facets of the mesa-etched region R, the second conductive semiconductor layer 27 and the active layer 25 of each of the unit light-emitting devices UD may be exposed. A width of the mesa-etched region R may narrow toward the substrate 10.

On the second conductive semiconductor layer 27 of each of the unit light-emitting devices UD, a current-spreading conductive layer 44 may be formed. The current-spreading conductive layer 44 may be a light-transmitting conductive layer. For example, the current-spreading conductive layer 44 may be indium tin oxide (ITO), Ni/Au, or Cu/Au.

After that, an insulating layer is formed on the entire substrate surface and then patterned to form a separating insulating layer 40 that covers the concave-convex patterns 10a exposed in the separation groove G and the facets of the unit light-emitting devices UD and a passivation layer 43 that is disposed on the current-spreading conductive layer 44. The separating insulating layer 40 may be extended onto a facet on one side in a mesa-etched region R adjacent to the separation groove G. The passivation layer 43 may be extended onto a facet on the other side in the mesa-etched region R, and may expose a part of the current-spreading conductive layer 44. The separating insulating layer 40 and the passivation layer 43 may be polyimide layers, silicon oxide layers, or silicon nitride layers.

An interconnection 46 that electrically connects one pair of adjacent unit light-emitting devices UD may be formed on the separating insulating layer 40. The interconnection 46 may electrically connect the second conductive semiconductor layer 27 (or the current-spreading conductive layer 44) of a first device of the pair of unit light-emitting devices UD, and the first conductive semiconductor layer 23 exposed in the mesa-etched region R of a second device of the pair of unit light-emitting devices UD. In this case, the unit light-emitting devices UD may be connected in series by the interconnection 46, thus exhibiting a high operating voltage.

The separating insulating layer 40 may be present between the interconnection 46 and the second conductive semiconductor layer 27 of the second device. The width of the mesa-etched region R may narrow toward the substrate 10, and in this case, disconnection of the interconnection 46 may be prevented.

FIG. 7a and FIG. 7b are schematic diagrams schematically showing that light emitted from an active layer is reflected in several directions by a concave-convex pattern in a lower portion of an LED and a concave-convex pattern in a separation groove, respectively.

Referring to FIG. 7a, when the LED described with reference to FIG. 1j operates, light traveling from the active layer 25 (of FIG. 1j) toward the substrate 10 (of FIG. 1j) under the active layer 25 collides with convexes 10av. At this time, since the convexes 10av have pointed vertexes V rather than planes in upper portions thereof and have facets UF and LF having inclination angles with respect to the substrate surface, the light traveling from the active layer 25 (of FIG. 1j) may be reflected in several directions. As a result, light extraction efficiency can be improved.

Referring to FIG. 7b, light traveling from the active layer 25 (of FIG. 1j) toward the substrate in the separation groove G collides with convexes 10av and concaves 10ac between the convexes 10av. At this time, as described with reference to FIG. 7a, the light may be reflected in several directions due to the shape of the convexes 10av, that is, facets UF and LF having the inclination angles and pointed vertexes. Also, the light may be irregularly reflected by pits P in surfaces of the concaves 10ac as well as surfaces of the convexes 10av. As a result, light extraction efficiency can be further improved.

FIG. 8a to FIG. 8e are cross-sectional views illustrating a method of fabricating an LED according to another exemplary embodiment of the present invention. The method of fabricating an LED according to this embodiment may be similar to the fabrication method described with reference to FIG. 1a to FIG. 1j except for descriptions below.

Referring to FIG. 8a, concave-convex patterns 10a may be formed in an upper surface of a substrate 10. The concave-convex patterns 10a may be formed using a method described with reference to FIG. 1a to FIG. 1e.

After a metal layer (not shown) is stacked on the concave-convex patterns 10a, the substrate on which the metal layer is stacked may be heat-treated, such that metal clusters 34 may be formed. A photoresist pattern 37 may be formed on the metal clusters 34. The photoresist pattern 37 may expose some areas, specifically, a first area A1 and a second area A2. The first area A1 may correspond to a separation groove to be described later, and the second area A2 may correspond to a mesa-etched region to be described later. However, the photoresist pattern 37 is not limited to this description, and may only expose the first area A1 corresponding to a separation groove to be described later.

After that, using the photoresist pattern 37 and the metal clusters 34 as a mask, surfaces of the concave-convex patterns 10a of the first area A1 and the second area A2 may be etched. As a result, pits P (of FIG. 8b) may be formed in the surfaces of the concave-convex patterns 10a of the first area A1 and the second area A2, specifically, surfaces of convexes 10av and surfaces of concaves 10ac.

Referring to FIG. 8b, the photoresist pattern 37 and the metal clusters 34 may be removed. As a result, the concave-convex patterns 10a having the surface pits P may be exposed in the first area A1 and the second area A2.

Referring to FIG. 8c, a buffer layer 21 may be formed on the substrate on which the concave-convex patterns 10a having the surface pits P are formed. As described with reference to FIG. 1f, in areas of the buffer layer 21 except for the first area A1 and the second area A2, a threading dislocation density is reduced due to morphological characteristics and crystallographically stabilized surfaces of the concave-convex patterns 10a, and the crystal quality can be improved. Meanwhile, in the first area A1 and the second area A2, threading dislocation may occur due to the surface pits P.

After that, a first conductive semiconductor layer 23, an active layer 25, and a second conductive semiconductor layer 27 may be formed on the buffer layer 21 in sequence. The buffer layer 21, the first conductive semiconductor layer 23, the active layer 25, and the second conductive semiconductor layer 27 may constitute a stacked body.

Referring to FIG. 8d, a portion of the stacked body above the first area A1 is etched until the substrate 10 is exposed, such that a separation groove G that separates unit light-emitting devices UD is formed. In the separation groove G, concave-convex patterns 10a having surface pits P may be exposed.

Referring to FIG. 8e, a mesa-etched region R that exposes the first conductive semiconductor layer 23 may be formed in an upper surface of each of the unit light-emitting devices UD. The mesa-etched region R corresponds to the second area A2. After that, as described with reference to FIG. 1j, a current-spreading conductive layer 44, a separating insulating layer 40, a passivation layer 43, and an interconnection 46 may be formed.

When such an LED operates, light traveling from the active layer 25 toward the substrate 10 under the active layer 25 collides with convexes 10av. At this time, since the convexes 10av have pointed vertexes V rather than planes in upper portions thereof and have facets UF and LF having inclination angles with respect to the substrate surface, the light traveling from the active layer 25 may be reflected in several directions. As a result, light extraction efficiency can be improved. In addition, light traveling from the active layer 25 toward the substrate in the separation groove G collides with convexes 10av and concaves 10ac between the convexes 10av. At this time, as described above, the light may be reflected in several directions due to the shape of the convexes 10av, and also may be irregularly reflected by pits P formed in surfaces of the convexes 10av as well as surfaces of the concaves 10ac. As a result, light extraction efficiency can be further improved by the pits P.

Meanwhile, when the stacked body is formed, threading dislocations may be caused by the surface pits P of the concave-convex patterns 10a above the first area A1. All the threading dislocations above the first area A1 may be removed in the process of forming the separation groove G. Also, when the stacked body is formed, threading dislocations may be caused by the surface pits P of the concave-convex patterns 10a above the second area A2 and propagated into the active layer 25 of the second area A2. However, when the mesa-etched region R is formed, the active layer 25 of the second area A2 is removed, and therefore deterioration in crystal quality of the active layer 25 may not be caused by such threading dislocations. Thus, the surface pits P of the concave-convex patterns 10a can improve light extraction efficiency without significantly deteriorating the epitaxial quality of the final device.

FIG. 9a to FIG. 9c are cross-sectional views illustrating a method of fabricating an LED according to another exemplary embodiment of the present invention. The method of fabricating an LED according to this exemplary embodiment may be similar to the fabrication method described with reference to FIG. 1a to FIG. 1j except for descriptions below.

Referring to FIG. 9a, a substrate 10 is provided. An etching mask layer 13 may be formed on an upper surface of the substrate 10. On the etching mask layer 13, a photoresist pattern 18 may be formed.

Referring to FIG. 9b, the etching mask layer 13 may be wet-etched or dry-etched using the photoresist pattern 18 as a mask. As a result, an etching mask pattern 13a may be formed. The etching mask pattern 13a may be formed to have a width of 0.2 to 1 µm. To this end, a width of the photoresist pattern 18 may be adjusted. The etching mask pattern 13a may be formed in a variety of shapes. For example, as shown in FIG. 2 to FIG. 4, the etching mask pattern 13a may have a stripe shape (FIG. 2), or a circular island shape (FIG. 3) or polygonal island shape (FIG. 4).

Referring to FIG. 9c, the photoresist pattern 18 may be removed to expose the etching mask pattern 13a. Using the etching mask pattern 13a as a mask, the substrate 10 is etched, such that concave-convex patterns 10a including concaves 10ac and convexes 10av may be formed in the upper surface of the substrate 10. The substrate 10 may be etched using a wet-etching method.

The convexes 10av have lower facets LF that are first crystal planes and upper facets UF that are second crystal planes different from the first crystal planes, and may have upper vertexes V at which the second crystal planes gather together. Bottom surfaces of the concaves 10ac present between the convexes 10av may be substantially parallel to the substrate surface.

The etching may be wet etching. An etching solution used in the etching process may exhibit remarkably different etching rates according to crystal directions of the substrate 10. In other words, the etching solution may preferentially etch the substrate 10 in a specific crystal direction. For example, the etching solution may be a mixed solution of sulfuric acid and phosphoric acid, a mixed solution of nitric acid and phosphoric acid, or a KOH solution when the substrate 10 is a sapphire substrate or a GaN substrate, a BOE or HF solution when the substrate 10 is a SiC substrate, and a KOH solution when the substrate 10 is a Si substrate. For example, when the substrate 10 is a c-plane sapphire substrate and the etching solution is obtained by mixing sulfuric acid and phosphoric acid at a volumetric ratio of 3:1, c-planes may be preferentially etched in the wet-etching process.

In such a wet-etching process, the substrate 10 exposed between the etching mask patterns 13a is etched, such that first crystal planes (dotted lines F) tilted at a first angle θ1 with respect to the substrate surface are shown in the surface. After that, the substrate 10 is further etched, such that the first crystal planes may be extended toward a lower portion of the substrate 10 to form the lower facets LF of the convexes 10av. Meanwhile, the first crystal planes (the dotted lines F) that are formed in the initial etching step and close to the surface of the substrate 10 may also be gradually etched to expose other crystal planes, that is, the second crystal planes tilted at a second angle θ2 with respect to the substrate surface, and the second crystal planes may be the upper facets UF. The second crystal planes may gather together to form the upper vertexes V.

In this way, since the etching mask pattern 13a is formed to have a small width, for example, a width of 0.2 to 1 µm, although the etching mask pattern 13a remains, the etching solution can sufficiently penetrate below the etching mask pattern 13a, such that the upper facets UF and the upper vertexes V can be formed.

When the process is performed thereafter according to the method described with reference to FIG. 1f to FIG. 1j, an LED as shown in FIG. 1j can be fabricated.

FIG. 10a to FIG. 10d are cross-sectional views illustrating a method of fabricating an LED according to another exemplary embodiment of the present invention. The method of fabricating an LED according to this embodiment may be similar to the fabrication method described with reference to FIG. 1a to FIG. 1j except for descriptions below.

Referring to FIG. 10a, an etching mask pattern 13a may be formed on a substrate 10. The etching mask pattern 13a may be formed in a similar method to that described with reference to FIG. 1a and FIG. 1b. The etching mask pattern 13a may be a silicon oxide layer, a silicon nitride layer, or a silicon oxynitride layer. However, the etching mask pattern 13a is not limited to these and can be any material having an etching selectivity with respect to the substrate 10. The etching mask pattern 13a may be formed in a variety of shapes. For example, as shown in FIG. 2 to FIG. 4, the etching mask pattern 13a may have a stripe shape (FIG. 2), or a circular island shape (FIG. 3) or polygonal island shape (FIG. 4). When unit patterns of the etching mask pattern 13a have island shapes, the unit patterns of the etching mask pattern 13a may be disposed such that six unit patterns surround one unit pattern in a hexagonal shape. However, the shape of the etching mask pattern 13a is not limited to this.

Using the etching mask pattern 13a as a mask, the substrate 10 is etched, such that concave-convex patterns 10a including concaves 10ac and convexes 10av may be formed in an upper surface of the substrate 10. The substrate 10 may be etched using a wet-etching method.

An etching solution used in the wet etching may exhibit remarkably different etching rates according to crystal directions of the substrate 10. In other words, the etching solution may preferentially etch the substrate 10 in a specific crystal direction. For example, the etching solution may be a mixed solution of sulfuric acid and phosphoric acid, a mixed solution of nitric acid and phosphoric acid, or a KOH solution when the substrate 10 is a sapphire substrate or a GaN substrate, a BOE or HF solution when the substrate 10 is a SiC substrate, and a KOH solution when the substrate 10 is a Si substrate. For example, when the substrate 10 is a c-plane sapphire substrate and the etching solution is obtained by mixing sulfuric acid and phosphoric acid at a volumetric ratio of 3:1, c-planes may be preferentially etched in the wet-etching process.

Referring to FIG. 10b, the etching mask pattern 13a is removed to expose upper surfaces of the convexes 10av. The upper surfaces T of the convexes 10av may be planes, and facets S thereof may have a first inclination angle θ1 with respect to the substrate surface. These facets S may be first crystal planes. Also, angles of the facets S of the convexes 10av with respect to the substrate surface, that is, inclination angles, may be identical to or different from each other according to the facets S. Bottom surfaces of the concaves 10ac present between the convexes 10av and the upper surfaces of the convexes 10av may be substantially parallel to the substrate surface.

With reference to FIG. 11, the concave-convex patterns will be described in detail. A portion of FIG. 10b may correspond to a cross section taken along a cutting-plane line I-I' of FIG. 11.

Referring to FIG. 10b and FIG. 11, the concave-convex pattern 10a has the plurality of convexes 10av and the concaves 10ac defined by the convexes 10av. The bottom surfaces of the concaves 10ac present between the convexes 10av and the upper surfaces of the convexes 10av may be planes that are substantially parallel to the substrate surface, for example, c-planes. The convexes may have a stripe or island shape corresponding to the shape of the etching mask pattern 13a described with reference to FIG. 2 to FIG. 4.

However, when the etching mask pattern 13a has a circular or polygonal island shape, in particular, a circular shape, bottom surfaces defined by the lower facets LF of the convexes 10av may have a triangle-like shape of which each line segment is a curve projected to the outside as shown in FIG. 11. Also, the upper surfaces of the convexes 10av may have a circular shape according to the shape of the etching mask pattern 13a.

Referring to FIG. 10c, a buffer layer 21 may be formed on the substrate on which the concave-convex patterns 10a are formed. At this time, the buffer layer 21 may be vertically grown preferentially on the bottom surfaces of the concaves 10ac and the upper surfaces of the convexes 10av that are substantially parallel to the substrate surface. Also, since the bottom surfaces of the concaves 10ac and the facets S of the convexes 10av are stable crystal planes due to being formed through wet etching, there is a low probability that dislocation will occur above the bottom surfaces of the concaves 10ac and the facets S of the convexes 10av. Thus, the crystal quality can be improved.

When the process is performed thereafter according to the method described with reference to FIG. 1f to FIG. 1j, an LED as shown in FIG. 10d can be fabricated.

FIG. 12a to FIG. 12d are cross-sectional views illustrating a method of fabricating an LED according to another exemplary embodiment of the present invention. The method of fabricating an LED according to this embodiment may be similar to the fabrication method described with reference to FIG. 1a to FIG. 1j except for descriptions below.

Referring to FIG. 12a, an etching mask pattern 13a may be formed on a substrate 10. The etching mask pattern 13a may be formed in a similar method to that described with reference to FIG. 1a and FIG. 1b.

Using the etching mask pattern 13a as a mask, the substrate 10 is etched, such that concave-convex patterns 10a including concaves 10ac and convexes 10av may be formed in an upper surface of the substrate 10. The substrate 10 may be etched using a wet-etching method.

An etching solution used in the wet etching may exhibit remarkably different etching rates according to crystal directions of the substrate 10. In other words, the etching solution may preferentially etch the substrate 10 in a specific crystal direction. For example, the etching solution may be a mixed solution of sulfuric acid and phosphoric acid, a mixed solution of nitric acid and phosphoric acid, or a KOH solution when the substrate 10 is a sapphire substrate or a GaN substrate, a BOE or HF solution when the substrate 10 is a SiC substrate, and a KOH solution when the substrate 10 is a Si substrate. For example, when the substrate 10 is a c-plane sapphire substrate and the etching solution is obtained by mixing sulfuric acid and phosphoric acid at a volumetric ratio of 3:1, c-planes may be preferentially etched in the wet-etching process. Upper surfaces of the convexes 10av may be planes, and facets thereof may have a first inclination angle θ1 with respect to the substrate surface. These facets may be first crystal planes. Also, angles of the facets of the convexes 10av with respect to the substrate surface, that is, inclination angles, may be identical to or different from each other according to the facets. Bottom surfaces of the concaves 10ac present between the convexes 10av and the upper surfaces of the convexes 10av may be substantially parallel to the substrate surface.

Referring to FIG. 12b, the substrate 10 having the concave-convex patterns 10a may be etched a second time using the etching mask pattern 13a as a mask. The second etching may be dry etching, specifically, anisotropic etching. In this process, the facets of the convexes 10av and the bottom surfaces of the concaves 10ac may be etched to a predetermined depth.

Referring to FIG. 12c, the etching mask pattern 13a is removed to expose the upper surfaces T of the convexes 10av. The convexes 10av have first facets S1, which are upper facets, and second facets S2, which are lower facets, having different inclination angles. Specifically, the first facets S1 adjacent to the upper surfaces T of the convexes 10av may be substantially perpendicular to the substrate surface, and the second facets S2 adjacent to the concaves 10ac may have an angle that is the same as or similar to the first inclination angle θ1 (of FIG. 12a) with respect to the substrate surface.

When the process is performed thereafter according to the method described with reference to FIG. 1f to FIG. 1j, an LED as shown in the drawing can be fabricated (see FIG. 12d).

FIG. 13a to FIG. 13d are cross-sectional views illustrating a method of fabricating an LED according to another exemplary embodiment of the present invention. The method of fabricating an LED according to this embodiment may be similar to the fabrication method described with reference to FIG. 1a to FIG. 1j except for descriptions below.

Referring to FIG. 13a, an etching mask pattern 13a may be formed on a substrate 10. The etching mask pattern 13a may be formed in a similar method to that described with reference to FIG. 1a and FIG. 1b.

Using the etching mask pattern 13a as a mask, the substrate 10 is etched, such that concave-convex patterns 10a including concaves 10ac and convexes 10av may be formed in an upper surface of the substrate 10. The substrate 10 may be etched using a dry-etching method, specifically, an anisotropic etching method. In this case, facets of the convexes 10av may be substantially perpendicular to the substrate surface.

Referring to FIG. 13b, the substrate 10 having the concave-convex patterns 10a may be etched a second time using the etching mask pattern 13a as a mask. The second etching may be wet etching. An etching solution used in the wet etching may exhibit remarkably different etching rates according to crystal directions of the substrate 10. In other words, the etching solution may preferentially etch the substrate 10 in a specific crystal direction. For example, the etching solution may be a mixed solution of sulfuric acid and phosphoric acid, a mixed solution of nitric acid and phosphoric acid, or a KOH solution when the substrate 10 is a sapphire substrate or a GaN substrate, a BOE or HF solution when the substrate 10 is a SiC substrate, and a KOH solution when the substrate 10 is a Si substrate. For example, when the substrate 10 is a c-plane sapphire substrate and the etching solution is obtained by mixing sulfuric acid and phosphoric acid at a volumetric ratio of 3:1, c-planes may be preferentially etched in the wet-etching process.

Referring to FIG. 13c, the etching mask pattern 13a is removed to expose upper surfaces T of the convexes 10av. The convexes 10av may have first facets S1 and second facets S2 having different inclination angles. In the wet-etching process, specific crystal planes are preferentially etched to form the second facets S2, which have a predetermined inclination angle with respect to the substrate surface and may be upper facets formed adjacent to the upper surfaces T of the convexes 10av and lower facets formed adjacent to the bottom surfaces of the concaves 10ac. Also, the first facets S1 that are intermediate facets present between the second facets S2 may be substantially perpendicular to the substrate surface.

When the process is performed according to the method described with reference to FIG. 1f to FIG. 1j, an LED as shown in the drawing can be fabricated (see FIG. 13d).

To aid in understanding the present invention, preferred experimental examples will be described below. These experimental examples are merely for aiding in understanding the present invention, and the present invention is not limited to the experimental examples below.

Fabrication Example 1 of Concave-Convex Patterns

After a silicon oxide layer was formed on a c-plane sapphire substrate, a photoresist pattern was formed on the silicon oxide layer. The photoresist pattern was an array of unit patterns having a circular shape similar to that shown in FIG. 5. Using the photoresist pattern as a mask, the silicon oxide layer was etched with HF to form a silicon oxide pattern. After that, the photoresist pattern was removed. Using the silicon oxide pattern as a mask, the substrate was etched with a mixed solution obtained by mixing sulfuric acid and phosphoric acid at a volumetric ratio of 3:1. After that, the silicon oxide pattern was removed to form concave-convex patterns having convexes whose upper surfaces were planes and concaves whose bottom surfaces were planes.

Fabrication Example 2 of Concave-Convex Patterns

Using a similar method to that of concave-convex pattern fabrication example 1, concave-convex patterns were formed in an upper surface of the substrate except that the substrate was dry-etched using the silicon oxide pattern as a mask.

Fabrication Example 3 of Concave-Convex Patterns

The substrate that was a result of concave-convex pattern fabrication example 1 was etched a second time using a mixed solution obtained by mixing sulfuric acid and phosphoric acid at a volumetric ratio of 3:1.

Fabrication Example 4 of Concave-Convex Patterns

A 10-nm nickel layer was formed on the concave-convex patterns according to concave-convex pattern fabrication example 2 and then heat-treated to form nickel clusters on the concave-convex patterns. Using the nickel clusters as a mask, the concave-convex patterns were plasma-etched, and then the nickel clusters were removed.

Fabrication Example 1 of LED

Using MOCVD, an undoped GaN layer was formed on a substrate that had concave-convex patterns formed according to concave-convex pattern fabrication example 1. An n-type GaN layer was formed on the undoped GaN layer, and then an active layer having an InGaN/GaN MQW structure was formed on the n-type GaN layer. After that, a p-type GaN layer was formed on the active layer, and then a mesa-etched region that exposed the n-type GaN layer was formed. After that, an ITO layer was formed on the p-type GaN layer, and an n-type electrode and a p-type electrode were formed on the n-type GaN layer exposed in the mesa-etched region and the ITO layer, respectively.

Fabrication Example 2 of LED

An LED was fabricated using a similar method to that of LED fabrication example 1 except that a substrate according to concave-convex fabrication example 2 was used.

Fabrication Example 3 of LED

An LED was fabricated using a similar method to that of LED fabrication example 1 except that a substrate according to concave-convex fabrication example 3 was used.

FIG. 14 and FIG. 15 are scanning electron microscope (SEM) images respectively taken after epitaxial layers were grown on concave-convex patterns in accordance with concave-convex pattern fabrication examples 1 and 2.

Referring to FIG. 14 and FIG. 15, when a concave-convex pattern was formed by dry etching, crystallographic mismatch such as a fine void VD generated between an inclined plane of the concave-convex pattern and an epitaxial layer 121, and also dislocation D occurred in the epitaxial layer 121 (LED fabrication example 2, FIG. 15). On the other hand, when a concave-convex pattern 10a was formed by wet etching, no fine void VD was observed on the interface between an inclined plane of the concave-convex pattern 10a and an epitaxial layer 21, almost no dislocation was observed, and thus it is possible to know that the crystal quality was favorable (LED fabrication example 1, FIG. 14).

The results of an electrostatic discharge (ESD) experiment on LEDs in accordance with LED fabrication examples 1 and 2, were that LEDs in accordance with fabrication example 1 exhibited an ESD yield (indicates a ratio of LEDs that operate normally after a constant voltage of 1 kV is applied three times to a plurality of LEDs) of 71.07%, whereas an ESD yield of LEDs in accordance with fabrication example 2 was 0.33%. This is considered to be due to the fact that, compared to the LED (fabrication example 2) having concave-convex patterns (concave-convex pattern fabrication example 2) formed using dry etching, the LED (fabrication example 1) having concave-convex patterns (concave-convex pattern fabrication example 1) formed using wet etching has an epitaxial layer in which the crystal quality is improved.

FIG. 16a to FIG. 16c are SEM images of a substrate having concave-convex patterns fabricated according to concave-convex pattern fabrication example 3.

Referring to FIG. 16a to FIG. 16c, concave-convex patterns 10a having convexes 10av and concaves 10ac defined by the convexes 10av were formed in an upper surface of a substrate. The convexes 10av had lower facets LF and upper facets UF, and the upper facets UF gathered together to form upper vertexes V. An angle $\theta_2$ of the upper facets UF with respect to the substrate surface was smaller than an angle $\theta_1$ of the lower facets LF with respect to the substrate surface.

Bottom surfaces defined by the lower facets LF of the convexes 10av had a triangle-like shape of which each line segment was a curve projected to the outside. Also, the upper facets UF of the convexes 10av had an almost hexagonal shape from the top view.

FIG. 17 is a graph showing output power versus current of LEDs that were respectively fabricated according to LED fabrication example 2 and LED fabrication example 3.

Referring to FIG. 17, it can be seen that, compared to an LED in accordance with fabrication example 2, an LED in accordance with fabrication example 3 has improved efficiency droop in a high voltage region. This means that the LED in accordance with fabrication example 3, which is an LED having concave-convex patterns (concave-convex pattern fabrication example 3) formed through wet etching process twice and having shapes described above with referring to FIGS. 16a, 16b, and 16c, has improved epitaxial quality compared to the LED in accordance with fabrication example 2, which is an LED having concave-convex patterns (concave-convex pattern fabrication example 2) formed through dry etching.

FIG. 18a and FIG. 18b are SEM images of a substrate having concave-convex patterns fabricated according to concave-convex pattern fabrication example 4.

Referring to FIG. 18a and FIG. 18b, it can be seen that a plurality of pits P were formed on surfaces of convexes 10av and concaves 10ac of concave-convex patterns 10a. These pits P irregularly reflect light traveling from an active layer, such that light extraction efficiency can be improved.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A light emitting diode (LED), comprising:
   a substrate including a first region and a second region and located between an upper surface and a lower surface that are on opposite sides of the substrate, wherein the upper surface is over both the first region and the second region, and is located on a first side of the substrate and has concave-convex patterns including convex portions and concave portions defined by the convex portion; and
   a stacked structure disposed over the first region, and not disposed over the second region, the stacked structure comprising a first conductive semiconductor layer located on the first side of the substrate, an active layer disposed over the first conductive semiconductor layer, and a second conductive semiconductor layer disposed over the active layer,
   wherein the upper surface of the first region has a first roughness and the upper surface of the second region has a second, different roughness due to presence of pits.

2. The LED of claim 1, further comprising an insulation layer formed over the concave-convex patterns of the second region.

3. The LED of claim 2, wherein the insulation layer has a shape corresponding to a contour of the convex portions of the second region.

4. The LED of claim 2, wherein the insulation layer extends to cover a side of the stacked structure.

5. The LED of claim 1, wherein the first conductive semiconductor layer includes a nitride-based semiconductor layer.

6. The LED of claim 1, wherein the convex portions of the first region and the second region have facets that are crystal planes.

7. The LED of claim 1, wherein the concave-convex patterns of the second region have pits formed on a surface of the concave-convex patterns of the second region.

8. The LED of claim 1, further comprising an interconnection layer formed over the second region and extending to cover a side of the stacked structure.

9. The LED of claim 1, further comprising a current-spreading conductive layer formed over the second conductive semiconductor layer of the stacked structure.

10. A light emitting diode (LED), comprising:
    a substrate including a first, second, and third regions and located between an upper surface and a lower surface that are on opposite sides of the substrate, wherein the upper surface is over both the first region and the second region, and is located on a first side of the substrate and including concave-convex patterns including concave portions and convex portions; and
    unit light emitting modules formed over the first and third regions of the substrate and located on the first side of the substrate, each unit light emitting module including a stacked structure of a first conductive semiconductor layer, an active layer, and a second conductive semiconductor layer, the stacked structure not being disposed over the second region; and
    a grooved region formed over the second region and between two adjacent unit light emitting modules, wherein at least one of the convex portions formed on the upper surface of the second region has a crystal plane that is different from the convex portions formed on the upper surface of the first or third region, and the concave-convex patterns formed on the upper surface of the second region comprise surface pits causing the second region to have improved light extraction efficiency in the second region compared to that in the first or the third region.

11. The LED of claim 10, further comprising an insulation layer formed over the concave-convex portions of the second region and sides of the unit light emitting modules.

12. The LED of claim 11, wherein the insulation layer formed over the concave-convex portions of the second region has a shape corresponding to a contour of the convex portions of the second region.

13. The LED of claim 10, wherein each unit light emitting module has a mesa-etched region to expose the first conductive semiconductor layer.

14. The LED of claim 10, further comprising an interconnection layer formed over the second region of the substrate to electrically connect the two adjacent unit light emitting modules.

15. The LED of claim 10, wherein the concave-convex patterns of the second region have pits formed on a surface of the concave-convex patterns of the second region.

16. The LED of claim 10, further comprising a buffer layer formed over at least one of the first or third regions of the substrate.

17. The LED of claim 10, wherein the two adjacent unit light emitting modules are electrically connected in series.

18. The LED of claim 10, further comprising a current-spreading conductive layer disposed over the second conductive semiconductor layer of each unit light-emitting module.

* * * * *